(12) United States Patent
Cameron et al.

(10) Patent No.: US 7,149,953 B2
(45) Date of Patent: Dec. 12, 2006

(54) EFFICIENT LDPC CODE DECODING WITH NEW MINUS OPERATOR IN A FINITE PRECISION RADIX SYSTEM

(75) Inventors: Kelly Brian Cameron, Irvine, CA (US); Hau Thien Tran, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 212 days.

(21) Appl. No.: 10/782,142

(22) Filed: Feb. 19, 2004

(65) Prior Publication Data

US 2005/0172209 A1 Aug. 4, 2005

Related U.S. Application Data

(60) Provisional application No. 60/541,433, filed on Feb. 3, 2004.

(51) Int. Cl.
*H03M 13/03* (2006.01)
*G06F 11/00* (2006.01)
*H03M 13/11* (2006.01)
*H04L 27/06* (2006.01)

(52) U.S. Cl. ........................... 714/794; 714/801
(58) Field of Classification Search ................ 714/794, 714/800–801, 807
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B1 | 5/2003 | Goldstein et al. | |
| 6,633,856 B1 | 10/2003 | Richardson et al. | |
| 2003/0104788 A1 | 6/2003 | Kim | |

OTHER PUBLICATIONS

Mao et al., A new schedule for decoding low density parity check codes, 2001, IEEE, p. 1007-1010.*
Xiao-Yu et al., Efficient implementations of the sum-product algorithm for decoding LDPC codes, 2001, IEEE, p. 1036-1036E.*
Achilleas Anastasopoulos, A comparison between the sum-product and the min-sum iterative detection algorithms based on density evolution, 2001, IEEE, p. 1021-1025.*

(Continued)

*Primary Examiner*—Shelly Chase
(74) *Attorney, Agent, or Firm*—Garlick Harrison & Markison; Shayne X. Short

(57) ABSTRACT

Efficient LDPC code decoding with new minus operator in a finite precision radix system. A new mathematical operator is introduced and applied to the decoding of LDPC coded signals. This new operator is referred to as the min†– (min-dagger minus) operator herein. This min†– processing is appropriately applied during the updating of the edge messages with respect to the variable nodes. In a bit level decoding approach to decoding LDPC coded signals, the updating of the edge messages with respect to the bit nodes is performed using the new min†– operator. This approach provides very comparable performance to min** processing as also applied to updating of the edge messages with respect to the bit nodes and may also provide for a significant savings in hardware. Also, within finite precision radix systems, the new min†– operator provides a means by which always meaningful results may be achieved during the decoding processing.

35 Claims, 27 Drawing Sheets

OTHER PUBLICATIONS

Xiao-Yu et al., Progressive edge-growth Tannar graph, 2001, IEEE, p. 995-1001.*

R. Gallager, Low-Density Parity-Check Codes, Cambridge, MA: MIT Press, 1963.

M. Luby, M. Mitzenmacher, A. Shokrollahi, D. Spielman, and V. Stemann, "Practical loss-resilient codes," 1997.

T. J. Richardson and R. L. Urbanke, "The capacity of low-density parity-check code under message-passing decoding," IEEE Trans. Inform. Theory, vol. 47, pp. 599-618, Feb. 2001.

E. Eleftheriou and S. Olcer, "Low-Density Parity-Check Codes for Digital Subscriber Lines," 0-7803-7400-2/02, IEEE, 2002, pp. 1752-1757.

J. Hagenauer, E. Offer and L. Papke, "Iterative decoding of binary block and convolutional codes," IEEE Trans. Inform. Theory, vol. 42, No. 2 Mar. 1996, pp. 429-445.

E. Eleftheriou, T. Mittelholzer and A. Dholakia, "Reduced-complexity decoding algorithm for low-density parity-check codes," IEE Electronic Letters, vol. 37, pp. 102-104, Jan. 2001.

* cited by examiner

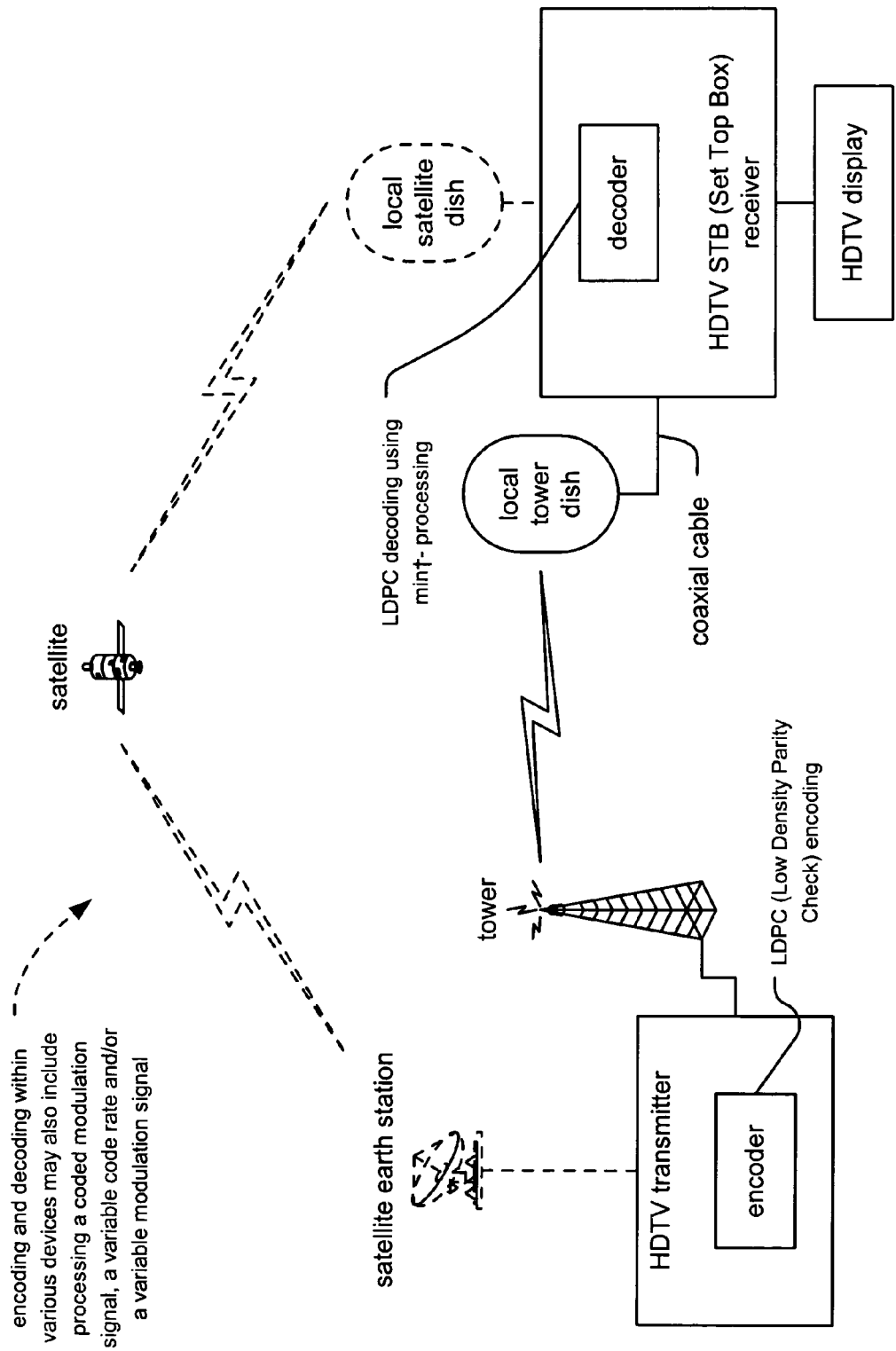

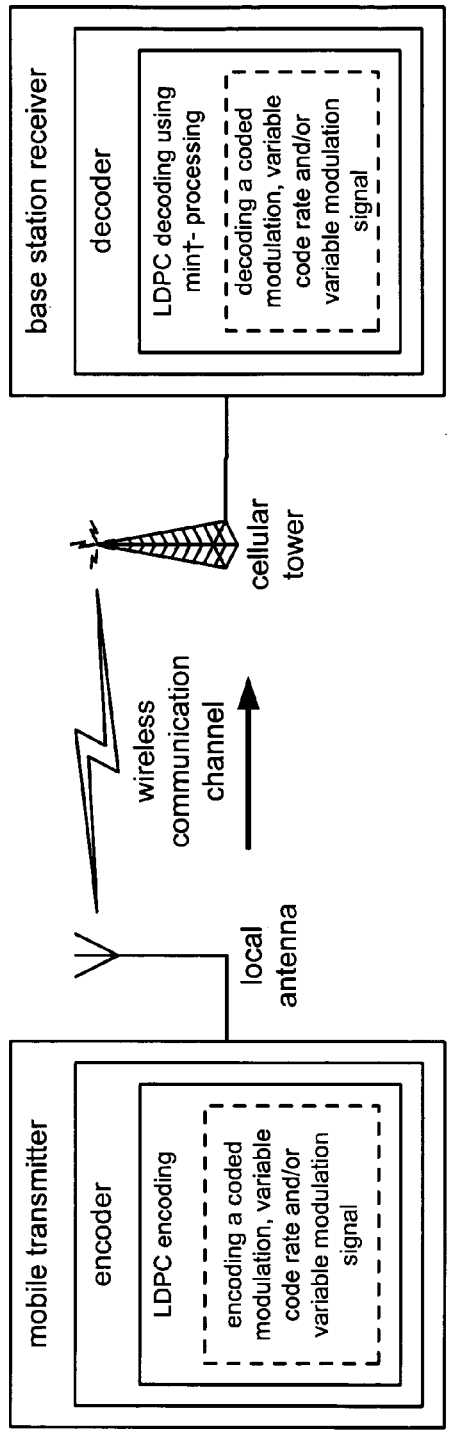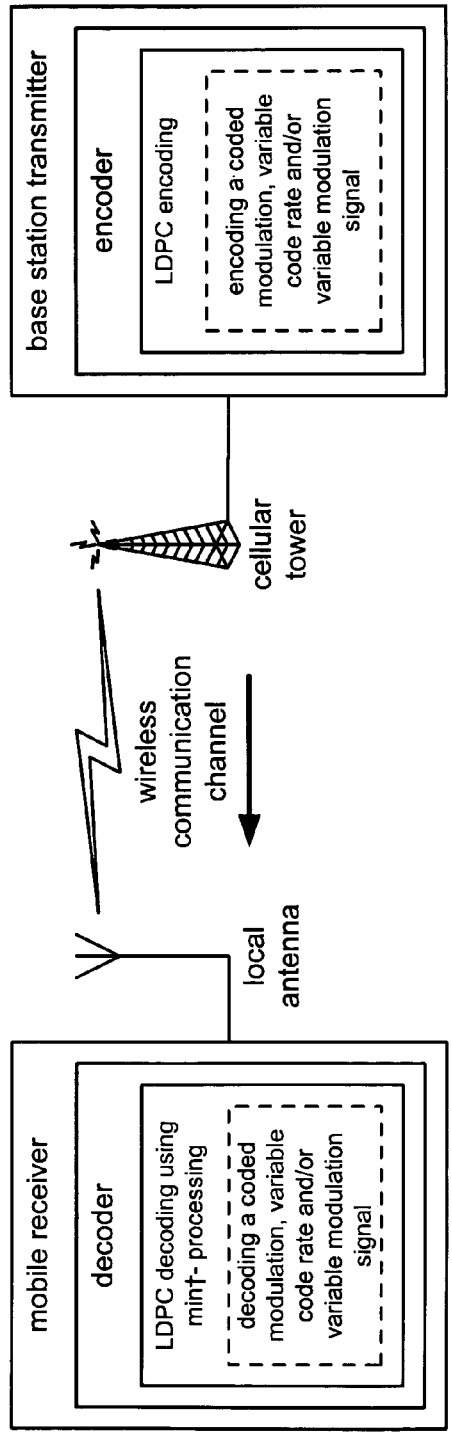

bi-directional cellular communication system uni-directional microwave communication system bi-directional microwave communication system uni-directional point-to-point radio communication system bi-directional point-to-point radio communication system uni-directional communication system Fig. 11 one to many communication system WLAN (Wireless Local Area Network) communication system fiber-optic communication system LDPC (Low Density Parity Check) code bipartite graph LDPC (Low Density Parity Check) code LLR (Log-Likelihood Ratio) decoding functionality LDPC (Low Density Parity Check) decoding functionality using bit metric alternative LDPC decoding functionality using bit metric (when performing n number of iterations)

processing of min* functional block (performs operation of min* operator)

processing of min*- functional block (performs operation of min*- operator)

processing of min† functional block (performs operation of min† operator)

processing of min†- functional block (performs operation of min†- operator)

method for performing updating edge messages with respect to bit nodes (B2C: bit-to-check step processing)

EFFICIENT LDPC CODE DECODING WITH NEW MINUS OPERATOR IN A FINITE PRECISION RADIX SYSTEM

CROSS REFERENCE TO RELATED PATENTS/PATENT APPLICATIONS

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/541,433, entitled "Efficient LDPC code decoding with new minus operator in a finite precision radix system," filed Feb. 3, 2004, pending.

The following U.S. Utility Patent Application is hereby incorporated herein by reference in its entirety and made part of the present U.S. Utility Patent Application for all purposes:

1. U.S. Utility Patent Application Ser. No. 10/369,168, entitled "Low Density Parity Check (LDPC) code decoder using min*, min**, max* or max** and their respective inverses," filed Feb. 19, 2003, pending."

BACKGROUND OF THE INVENTION

1. Technical Field of the Invention

The invention relates generally to communication systems; and, more particularly, it relates to decoding of communication signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC codes are oftentimes referred to in a variety of ways. For example, iterative soft decoding of LDPC codes may be implemented in a number of ways including based on the BP (Belief Propagation) algorithm, the SP (Sum-Product) algorithm, and/or the MP (Message-Passing) algorithm; the MP algorithm is sometimes referred to as a Sum Product/Belief Propagation combined algorithm. While there has been a significant amount of interest and effort directed towards these types of LDPC codes, regardless of which particular manner of iterative decoding algorithm is being employed in the specific case (3 of which are enumerated above: BP, SP, and MP), there still is ample room for improvement in the implementation and processing to be performed within a communication device to complete such decoding. For example, there are a variety of relatively complex and numerically burdensome calculations, data management and processing that must be performed to effectuate the accurate decoding of an LDPC coded signal.

A primary directive in these areas of development has been to try continually to lower the error floor within a communication system. The ideal goal has been to try to reach Shannon's limit in a communication channel. Shannon's limit may be viewed as being the data rate that is used in a communication channel, having a particular signal to noise ratio (SNR), that will achieve error free transmission through the channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB from the theoretical Shannon limit. While this example was achieved using an irregular LDPC code of a length of one million, it nevertheless demonstrates the very promising application of LDPC codes within communication systems.

In performing calculations when decoding a received signal, it is common for decoders to operate in the natural log (ln) domain; LDPC decoders also fall in to this category. By operating within the natural log domain, this converts all multiplications to additions, divisions to subtractions, and eliminates exponentials entirely, without affecting BER performance.

One somewhat difficult calculation is the natural log (ln) domain includes calculating the sum of exponentials as shown below:

$$\ln(e^a + e^b + e^c + \ldots)$$

This calculation can be significantly reduced in complexity using the Jacobian formula shown below:

$$\max^*(a,b) = \ln(e^a + e^b) = \max(a,b) + \ln(1 + e^{-|a-b|})$$

This calculation is oftentimes referred to as being a max* calculation or max* operation. It is noted that the Jacobian formula simplification of the equation shown above presents the max* operation of only two variables, a and b. This calculation may be repeated over and over when trying to calculate a longer sum of exponentials. For example, to calculate $\ln(e^a + e^b + e^c)$, the following two max* operations may be performed:

$$\max^*(a,b) = \ln(e^a + e^b) = \max(a,b) + \ln(1 + e^{-|a-b|}) = x$$

$$\max^*(a,b,c) = \max^*(x,c) = \ln(e^x + e^c) = \max(x,c) + \ln(1 + e^{-|x-c|})$$

While there has a been a great deal of development within the context of LDPC code, the extensive processing and computations required to perform decoding therein can be extremely burdensome—this one example above of the calculating the sum of exponentials illustrates the potentially complex and burdensome calculations needed when performing decoding. Sometimes the processing requirements are so burdensome that they simply prohibit their implementation within systems having very tight design budgets.

There have been some non-optimal approaches to deal with the burdensome calculations required to do such burdensome calculations. For example, in performing this basic max* operation, some decoders simply exclude the logarithmic correction factor of $\ln(1 + e^{-|a-b|})$ altogether and use only the max(a,b) result which may be implemented within a single instruction within a DSP (Digital Signal Processor). However, this will inherently introduce some degradation in decoder performance. Most of the common approaches that seek to provide some computational improvements either cut corners in terms of computational accuracy, or they do not provide a sufficient reduction in computational complexity to justify their integration. One of the prohibiting factors concerning the implementation of many LDPC codes is oftentimes the inherent computational complexity coupled with the significant amount of memory required therein.

There still exists a need in the art to provide for more efficient solutions when making calculations, such as max*, within decoders that operate within the logarithmic domain.

BRIEF SUMMARY OF THE INVENTION

Various aspects of the invention can be found in a decoder that updates a plurality of edge messages using min†− (min-dagger minus) processing when decoding an LDPC (Low Density Parity Check) coded signal. Most generally, the decoder performs iterative decoding processing involving updating of the edge messages with respect to check nodes and also updating of the edge messages with respect to variable nodes. In a bit level decoding approach, these variable nodes are bit node within an LDPC bipartite graph that corresponds to an LDPC code by which the LDPC coded signal is generated. The updating of the edge messages with respect to the bit nodes is performed using this newly introduced min†− processing.

The decoder includes an m-bit symbol metric computer functional block that calculates a plurality of m-bit symbol metrics that correspond to a symbol of the LDPC coded signal. The symbol has m-bits, and the LDPC coded signal includes a plurality of symbols. The decoder also includes a symbol node calculator functional block that calculates a plurality of bit metrics using the plurality of m-bit symbol metrics. The decoder also includes a bit node calculator functional block that computes soft messages corresponding to the m-bits of the symbol using the plurality of bit metrics. The decoder includes a check node operator functional block that provides a plurality of edge messages to the bit node calculator functional block. Again, the plurality of edge messages corresponds to a plurality of edges that communicatively couple a plurality of bit nodes to a plurality of check nodes within an LDPC bipartite graph that corresponds to an LDPC code by which the LDPC coded signal is generated. The bit node calculator functional block updates the plurality of edge messages provided from the check node operator functional block using the plurality of bit metrics calculated by the symbol node calculator functional block. The bit node calculator functional block performs min†− processing when updating the plurality of edge messages. The bit node calculator functional block provides the updated plurality of edge messages to the check node operator functional block while the bit node calculator functional block updates the soft messages corresponding to the m-bits of the symbol using the updated plurality of edge messages. The bit node calculator functional block and the check node operator functional block operate cooperatively to perform iterative decoding and to output best estimates of the m-bits of the symbol of the LDPC coded signal using latest updated soft messages corresponding to the m-bits of the symbol of the LDPC coded signal.

Other aspects of the invention can be found in a decoder that simply performs min†− processing on at least 2 input values. During various steps of decoding signals, mathematical calculations invariably are performed. The min†− processing approach may be employed and may also provide for a relatively easier implementation in hardware and also a high degree of performance. This LDPC bipartite graph that corresponds to an LDPC code by which the LDPC coded signal is generated may reduce latency of the calculations needed to be performed during the iterative decoding processing, and it may also provide for a savings in area of a device, in that, fewer functional blocks need to be employed to perform such min†− processing when compared to prior art approaches to performing the calculations required for decoding of LDPC coded signals.

In a very general embodiment, certain aspects of the invention may be found in a decoder that is operable to perform min†− (min-dagger minus) processing when decoding an LDPC (Low Density Parity Check) coded signal. In a generalized way, such a decoder, built according to the invention, may include a min†− processing functional block that includes a min*− processing functional block that performs min*− (min-star minus) processing on at least 2 input values. When the results of the min*− processing on the at least 2 input values is not substantially greater than zero, then the min†− processing functional block outputs a zero valued output. When the results of the min*− processing on the at least 2 input values is substantially greater than zero, then the min†− processing functional block outputs a result generated by the min*− processing on the at least 2 input values. The min*− processing functional block determines a minimum value among the at least 2 input values, and the min*− processing functional block also calculates a logarithmic correction factor using the at least 2 input values. The min*− processing functional block combines the minimum value and the logarithmic correction factor to generate the result of the min*− processing on the at least 2 input values.

In some embodiments, the LDPC coded signal that is decoded by a decoder as presented herein is an LDPC coded modulation signal (where LDPC coding and modulation coding to generate an LDPC coded modulation signal Moreover, in some embodiments, the encoding and decoding may be performed by combining LDPC coding and modulation coding to generate an LDPC coded signal. In some instances of the invention, the LDPC encoding is combined with modulation encoding to generate a variable modulation signal whose modulation may vary as frequently as on a symbol by symbol basis. That is to say, the constellation and/or mapping of the symbols of an LDPC coded variable modulation signal may vary as frequently as on a symbol by symbol basis. In addition, the code rate of the symbols of the coded signal may also vary as frequently as on a symbol by symbol basis. In general, an LDPC signal generated according to the encoding aspects of the invention may be characterized as a variable code rate and/or modulation signal.

Such a decoder built according to the invention may be implemented within a variety of types of communication devices that may be implemented within any number of types of communication systems. Some examples of such communication systems includes any one of a satellite communication system, an HDTV (High Definition Television) communication system, a cellular communication system, a microwave communication system, a point-to-point radio communication system, a uni-directional communication system, a bi-directional communication system, a one to many communication system, a fiber-optic communication system, a WLAN (Wireless Local Area Network) communication system, and a DSL (Digital Subscriber Line) communication system. Moreover, various types of methods may be performed to support the functionality described herein without departing from the scope and spirit of the invention as well.

BRIEF DESCRIPTION OF THE SEVERAL VIEWS OF THE DRAWINGS

FIG. 2 is a system diagram illustrating an embodiment of an HDTV (High Definition Television) communication system that is built according to the invention.

FIG. 3A and FIG. 3B are system diagrams illustrating embodiment of uni-directional cellular communication systems that are built according to the invention.

DETAILED DESCRIPTION OF THE INVENTION

Figure 1:
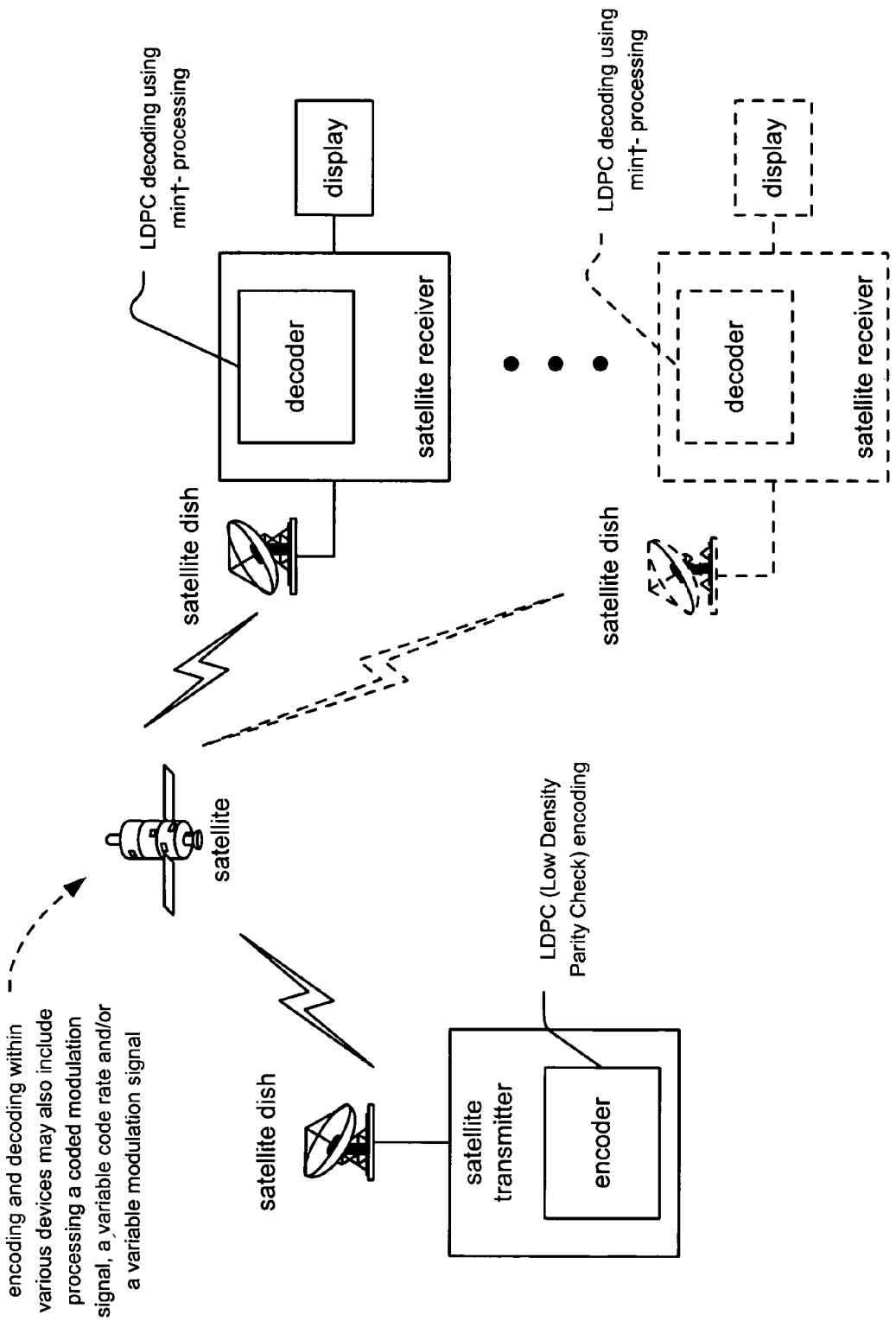
FIG. 1 is a system diagram illustrating an embodiment of a satellite communication system that is built according to the invention.

Various aspects of the invention may be found in any number of devices that perform either one or both of encoding and decoding of LDPC (Low Density Parity Check) coded signals. Moreover, in some embodiments, the encoding and decoding may be performed by combining LDPC coding and modulation coding to generate an LDPC coded modulation signal. In some instances of the invention, the LDPC encoding is combined with modulation encoding to generate a variable modulation signal whose modulation may vary as frequently as on a symbol by symbol basis. That is to say, the constellation and/or mapping of the symbols of an LDPC coded variable modulation signal may vary as frequently as on a symbol by symbol basis. In addition, the code rate of the symbols of the coded signal may also vary as frequently as on a symbol by symbol basis. In general, an LDPC signal generated according to the encoding aspects of the invention may be characterized as a variable code rate and/or modulation signal.

Various decoding aspects of the invention may be found in devices that perform decoding of LDPC coded signals using min†− (min-dagger minus) processing as is described below. More specifically, selective calculations within the variable node updating step (e.g. the bit node updating step in a bit decoding approach to decoding of LDPC coded signals) are performed using this new min†− operator. This provides for a high degree of performance while still also allowing for a possible savings in hardware.

Various system embodiments are described below where any of the various aspects of the invention may be implemented. In general, any communication device that performs decoding of LDPC coded signals may benefit from the invention. Again, this also includes those LDPC coded signals that have variable code rate and/or modulation as well as those LDPC coded signals that include combined LDPC coding and modulation coding (e.g., LDPC coded modulation signals).

Each of the various embodiments described below within the FIGS. 1–15 shows at least one exemplary communication system type in which a communication device may be implemented to support at least some of the various aspects of the invention. The general operations of these various communication systems types whose communication devices may benefit the invention are described below.

Within these various embodiments that employ an encoder and a decoder (or simply a decoder in a receiver end communication system or communication device), the operation of these encoder and/or decoder functional blocks is performed in accordance with the invention.

For example, any of the various encoders of the appropriate communication devices described herein may be implemented to perform LDPC encoding. This LDPC encoding may also be performed using LDPC coded modulation that combines LDPC encoding and modulation encoding. Moreover, the LDPC encoding may be performed to generate an LDPC coded signal whose code rate and/or modulation (constellation and mapping) may vary as frequently as on a symbol by symbol basis.

Where appropriate, any decoder of the appropriate communication devices described herein are implemented to perform decoding of LDPC coded signals, and the decoder is operable to accommodate the manner in which the LDPC encoding is performed in the encoder. For example, the decoder is operable to decode an LDPC coded signal, an LDPC coded modulation signal, and/or an LDPC coded signal whose code rate and/or modulation (constellation and mapping) varies as frequently as on a symbol by symbol basis.

Any decoder of the appropriate communication devices described herein is operable to perform LDPC decoding using the new minus operator: $\min\dagger-$ (which may be referred to as a min-dagger minus operator). The $\min\dagger-$ operator may be implemented within any number of functional blocks within such a decoder to perform $\min\dagger-$ processing (min-dagger minus processing) during the iterative decoding processing of an LDPC coded signal. The general operation of the various communication systems in which a decoder that performs $\min\dagger-$ processing is described below within the FIGS. 1–15. Afterwards and in the remaining Figures, greater detail is provided to illustrate the manner in which this new $\min\dagger-$ operator may be implemented.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) in a manner in accordance with the functionality and/or processing of at least some of the various aspects of the invention to assist in generating a signal that is to be launched into the communication channel coupling the satellite transmitter and the satellite receiver. The satellite receiver is operable to decode a signal (using a decoder) received from the communication channel in a manner in accordance with the functionality and/or processing of at least some of the various aspects of the invention. This diagram shows one embodiment where one or more of the various aspects of the invention may be found.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate for any up-converting that may have been performed before and during transmission of the signal from the HDTV transmitter and its corresponding tower to transform the signal into a format that is compatible with the communication channel across which it is transmitted. For example, certain communication systems step a signal that is to be transmitted from a baseband signal to an IF (Intermediate Frequency) signal, and then to a carrier frequency signal before launching the signal into a communication channel. Alternatively, some communication systems perform a conversion directly from baseband to carrier frequency before launching the signal into a communication channel. In whichever case is employed within the particular embodiment, the HDTV STB receiver is operable to perform any down-converting that may be necessary to transform the received signal to a baseband signal that is appropriate for demodulating and decoding to extract the information there from.

The HDTV STB receiver is also communicatively coupled to an HDTV display that is able to display the demodulated and decoded wireless transmitted signals received by the HDTV STB receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is ultimately destined for the HDTV STB receiver. For example, another satellite earth station may first transmit a signal to the satellite from another location, and the satellite may relay this signal to the satellite earth station that is communicatively coupled to the HDTV transmitter. In such a case the HDTV transmitter include transceiver functionality such that it may first perform receiver functionality and then perform transmitter functionality to transmit this received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and by whichever signal path the HDTV transmitter employs to communicate with the HDTV STB receiver, the HDTV STB receiver is operable to receive communication transmissions from the HDTV transmitter and to demodulate and decode them appropriately.

The HDTV transmitter is operable to encode information (using an encoder) in a manner in accordance with the functionality and/or processing of at least some of the various aspects of the invention to assist in generating a signal that is to be launched into the communication channel coupling the HDTV transmitter and the HDTV STB receiver. The HDTV STB receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmission functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) in a manner in accordance with the functionality and/or processing of at least some of the various aspects of the invention to assist in generating a signal that is to be launched into the communication channel coupling the mobile transmitter and the base station receiver. The base station receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) in a manner in accordance with the functionality and/or processing of at least some of the various aspects of the invention to assist in generating a signal that is to be launched into the communication channel coupling the base station transmitter and the mobile receiver. The mobile receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 4:
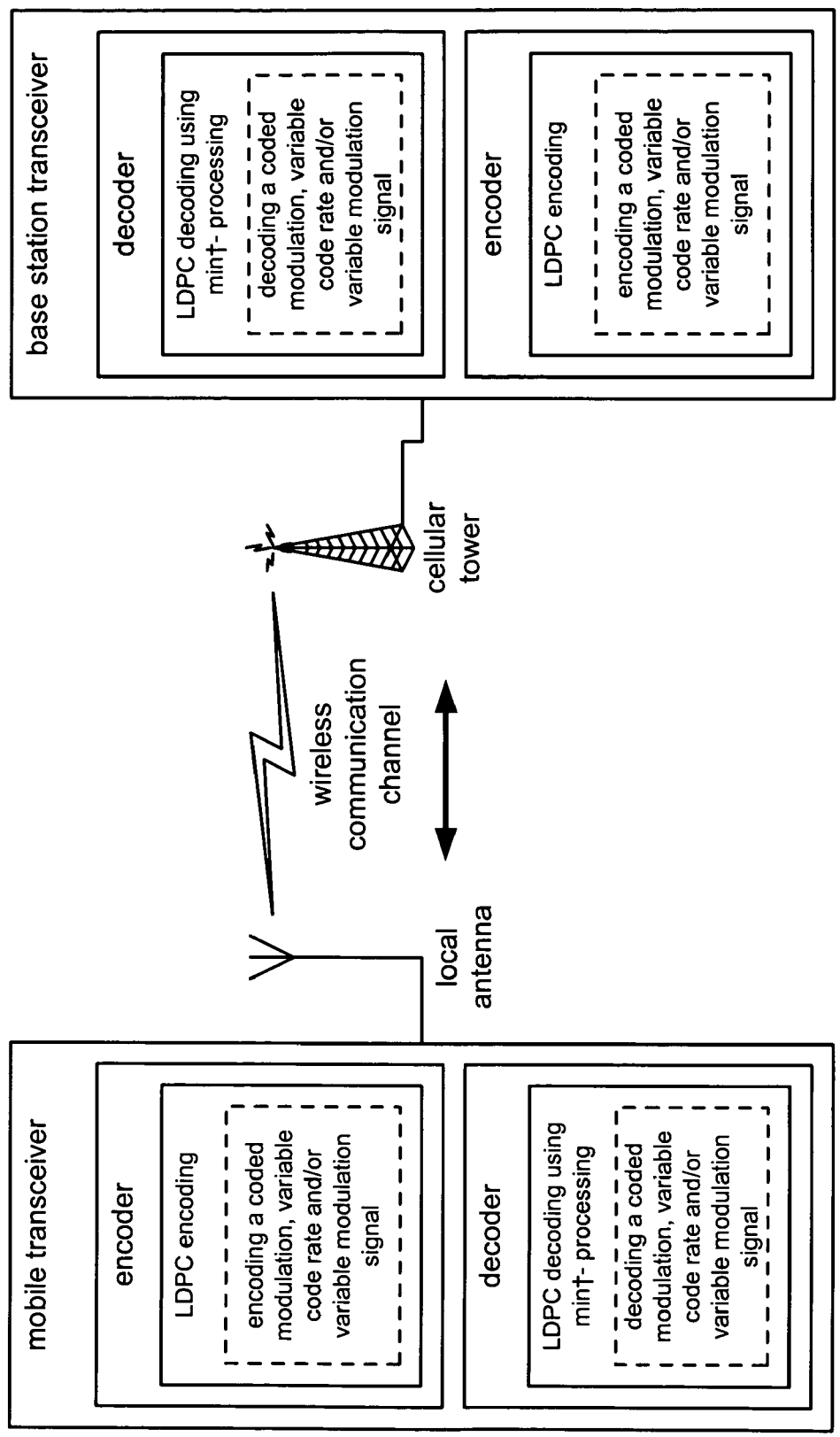
FIG. 4 is a system diagram illustrating an embodiment of a bi-directional cellular communication system that is built according to the invention.

FIG. 4 is a system diagram illustrating an embodiment of a bi-directional cellular communication system, built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceivers including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver. The mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be implemented to encode information (using its corresponding encoder) in a manner in accordance with the functionality and/or processing of at least some of the various aspects of the invention to assist in generating a signal that is to be launched into the communication channel coupling the base station transceiver and the mobile transceiver. The decoder of either of the base station transceiver or the mobile transceiver may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 5:
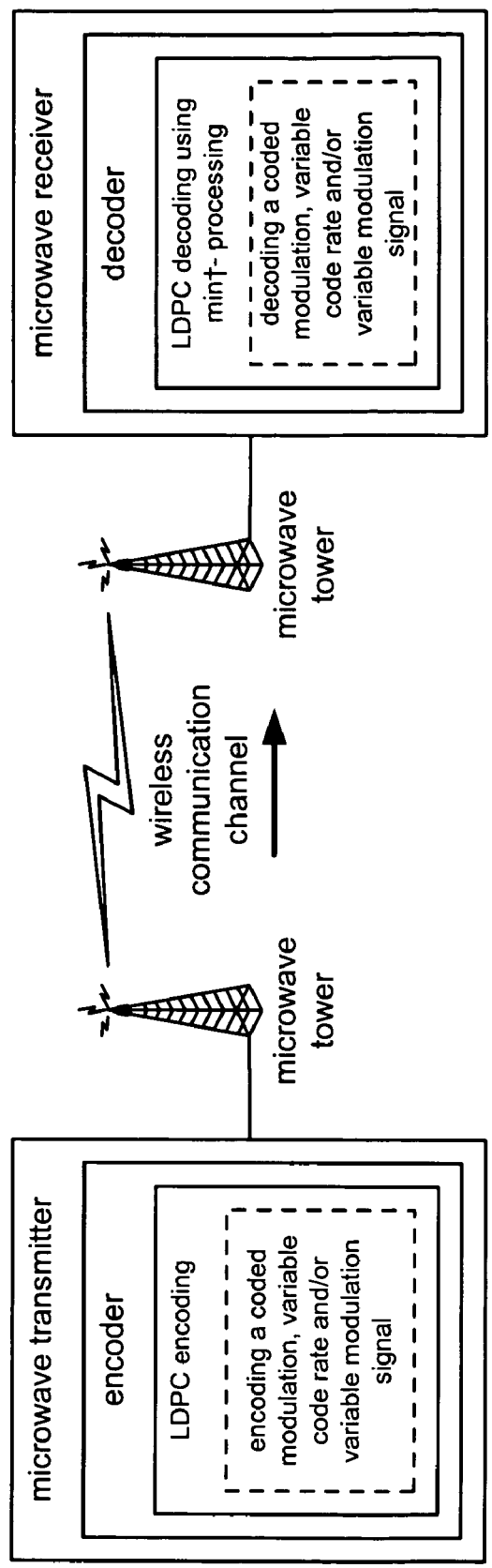
FIG. 5 is a system diagram illustrating an embodiment of a uni-directional microwave communication system that is built according to the invention.

FIG. 5 is a system diagram illustrating an embodiment of a unidirectional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) in a manner in accordance with the functionality and/or processing of at least some of the various aspects of the invention to assist in generating a signal that is to be launched into the communication channel coupling the microwave transmitter and the microwave receiver. The microwave receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 6:
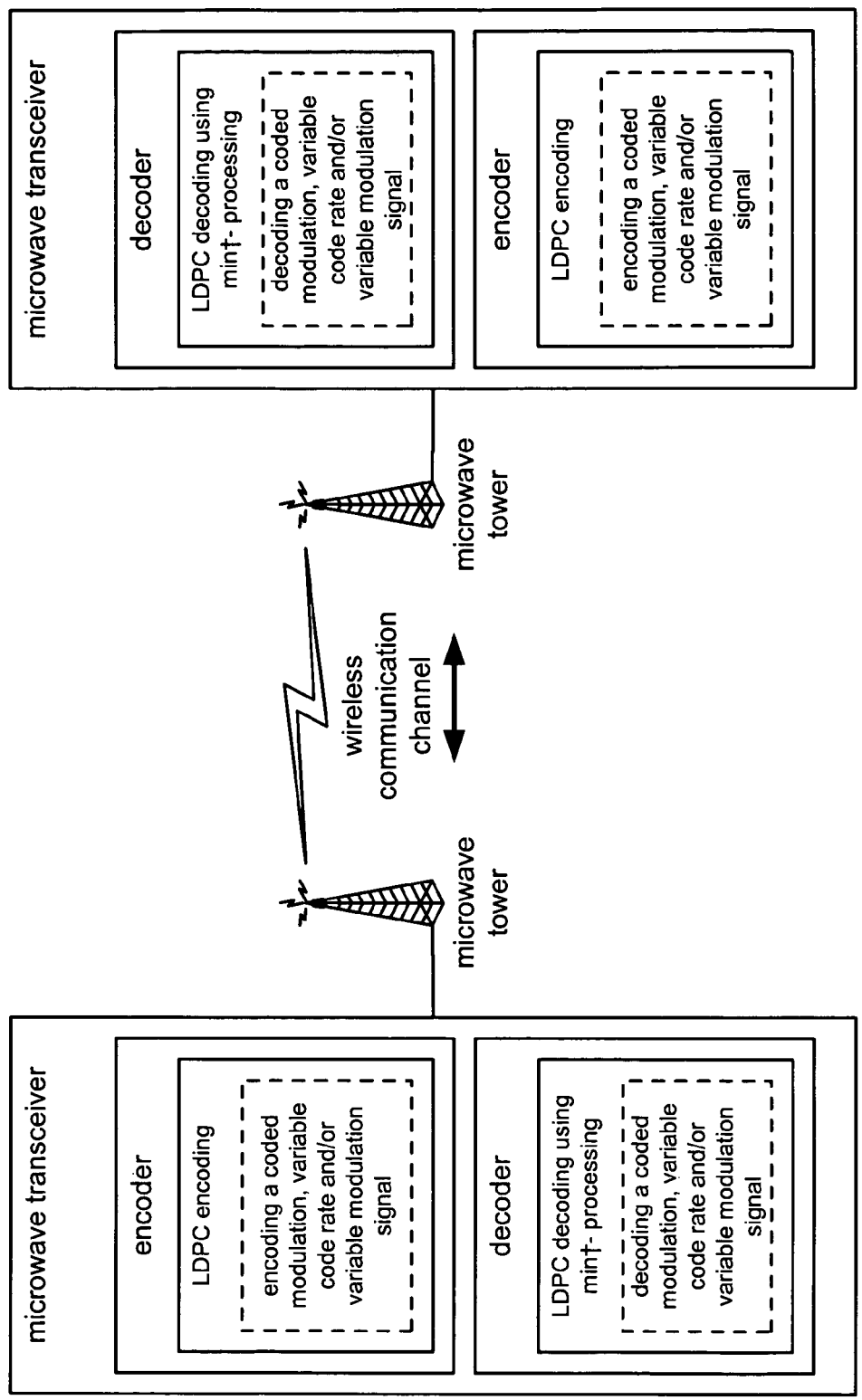
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within the FIG. 6, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using its corresponding encoder) that is to be transmitted the other microwave transceiver. Each microwave transceiver is operable to decode the transmitted signal (using its corresponding decoder) that it receives. Each of the microwave transceivers includes an encoder and a decoder.

As within other embodiments that employ an encoder and a decoder, the encoder of either of the microwave transceivers may be implemented to encode information (using its corresponding encoder) in a manner in accordance with the functionality and/or processing of at least some of the various aspects of the invention to assist in generating a signal that is to be launched into the communication channel coupling the microwave transceivers. The decoder of either of the microwave transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 7:
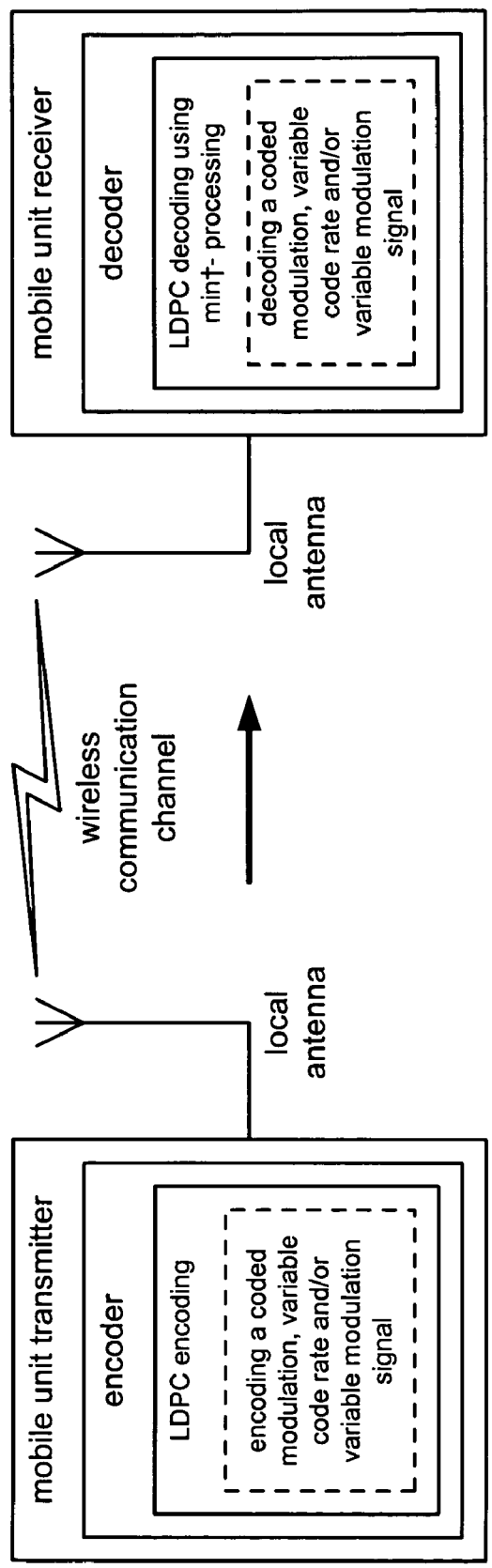
FIG. 7 is a system diagram illustrating an embodiment of a uni-directional point-to-point radio communication system that is built according to the invention.

FIG. 7 is a system diagram illustrating an embodiment of a uni-directional point-to-point radio communication system, built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) in a manner in accordance with the functionality and/or processing of at least some of the various aspects of the invention to assist in generating a signal that is to be launched into the communication channel coupling the mobile unit transmitter and the mobile unit receiver. The mobile unit receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 8:
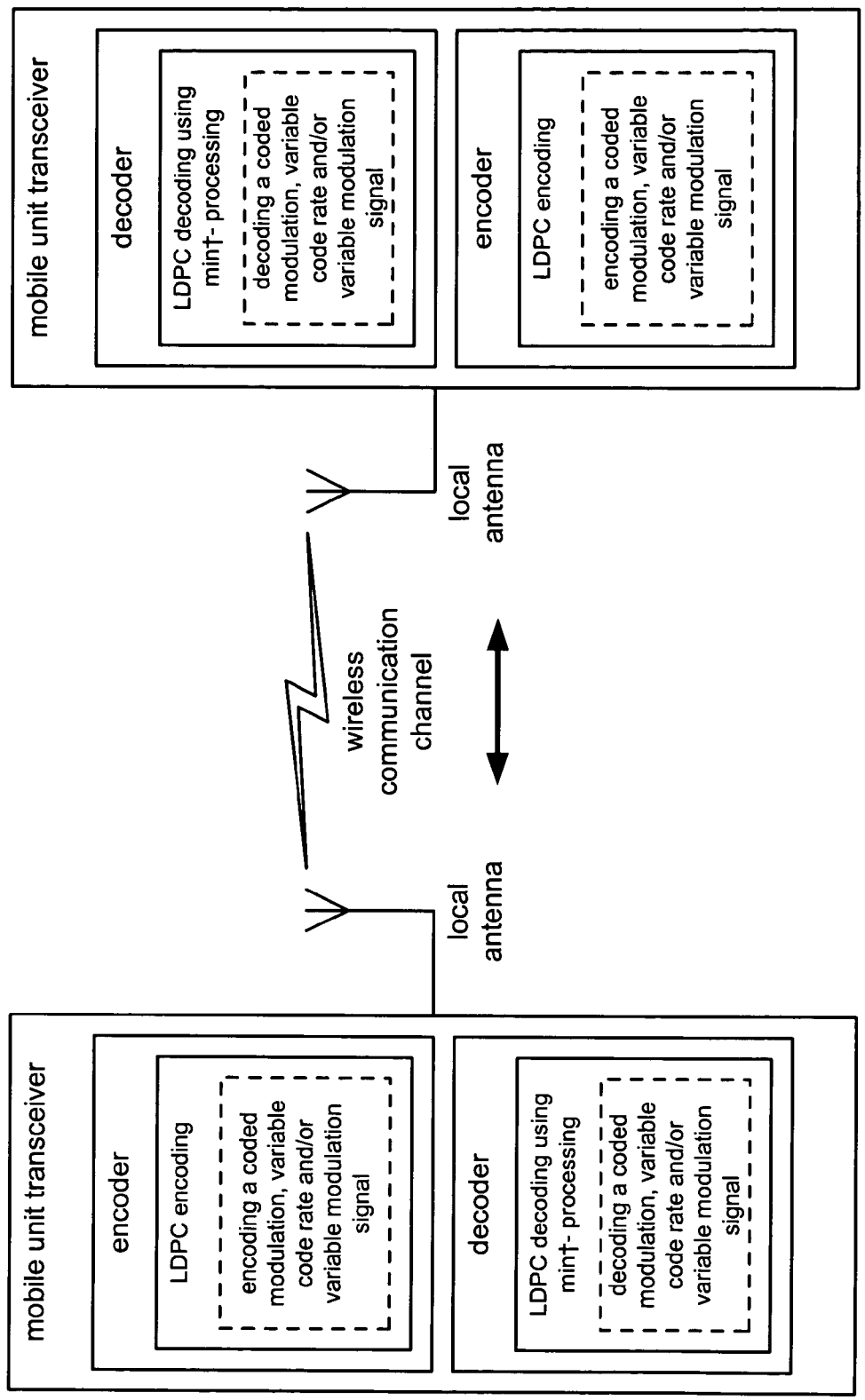
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. A first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each of the mobile unit transceivers is operable to encode information (using its corresponding encoder) that is to be transmitted the other mobile unit transceiver. Each mobile unit transceiver is operable to decode the transmitted signal (using its corresponding decoder) that it receives. Each of the mobile unit transceivers includes an encoder and a decoder.

As within other embodiments that employ an encoder and a decoder, the encoder of either of the mobile unit transceivers may be implemented to encode information (using its corresponding encoder) in a manner in accordance with the functionality and/or processing of at least some of the various aspects of the invention to assist in generating a signal that is to be launched into the communication channel coupling the mobile unit transceivers. The decoder of either of the mobile unit transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 9:
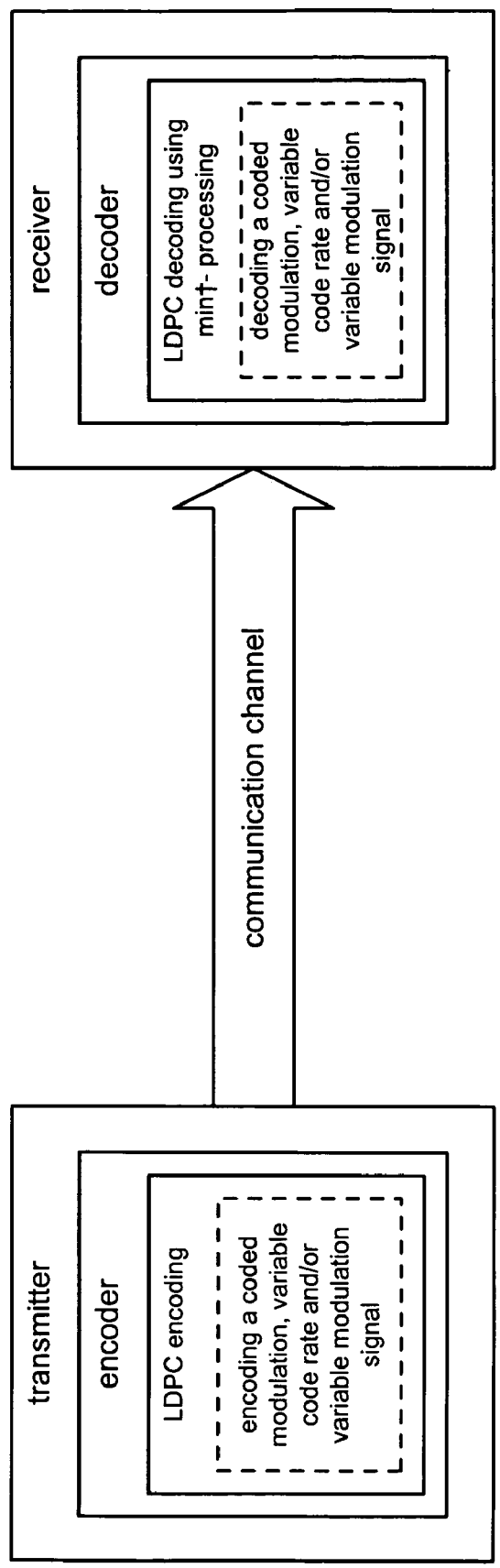
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) in a manner in accordance with the functionality and/or processing of at least some of the various aspects of the invention to assist in generating a signal that is to be launched into the communication channel coupling the transmitter and the receiver. The receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 10:
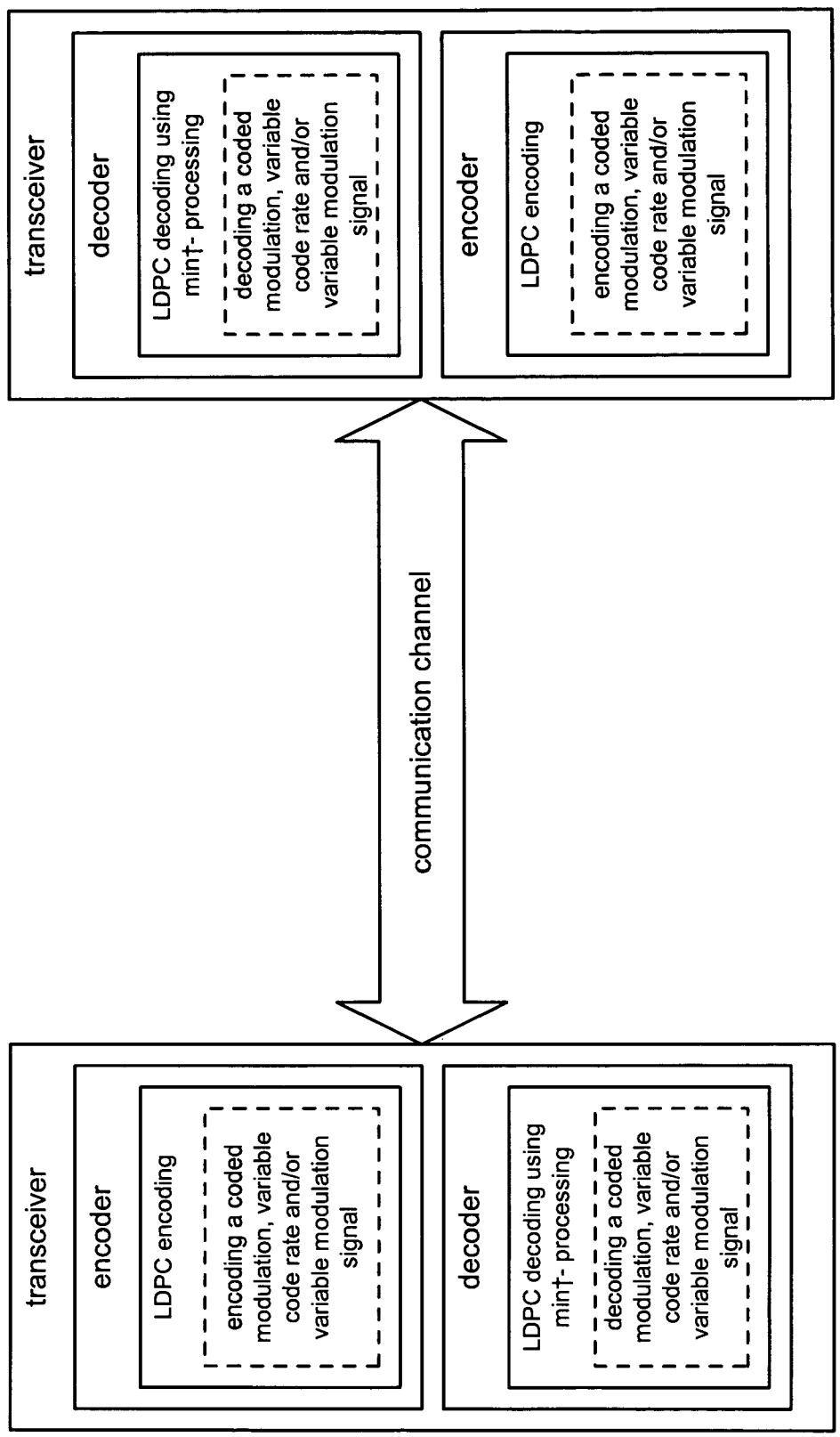
FIG. 10 is a system diagram illustrating an embodiment of a bi-directional communication system that is built according to the invention.

FIG. 10 is a system diagram illustrating an embodiment of a bi-directional communication system that is built according to the invention. A first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted the other transceiver. Each transceiver is operable to decode the transmitted signal (using its corresponding decoder) that it receives. Each of the transceivers includes an encoder and a decoder.

As within other embodiments that employ an encoder and a decoder, the encoder of either of the transceivers may be implemented to encode information (using its corresponding encoder) in a manner in accordance with the functionality and/or processing of at least some of the various aspects of the invention to assist in generating a signal that is to be launched into the communication channel coupling the transceivers. The decoder of either of the transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 11:
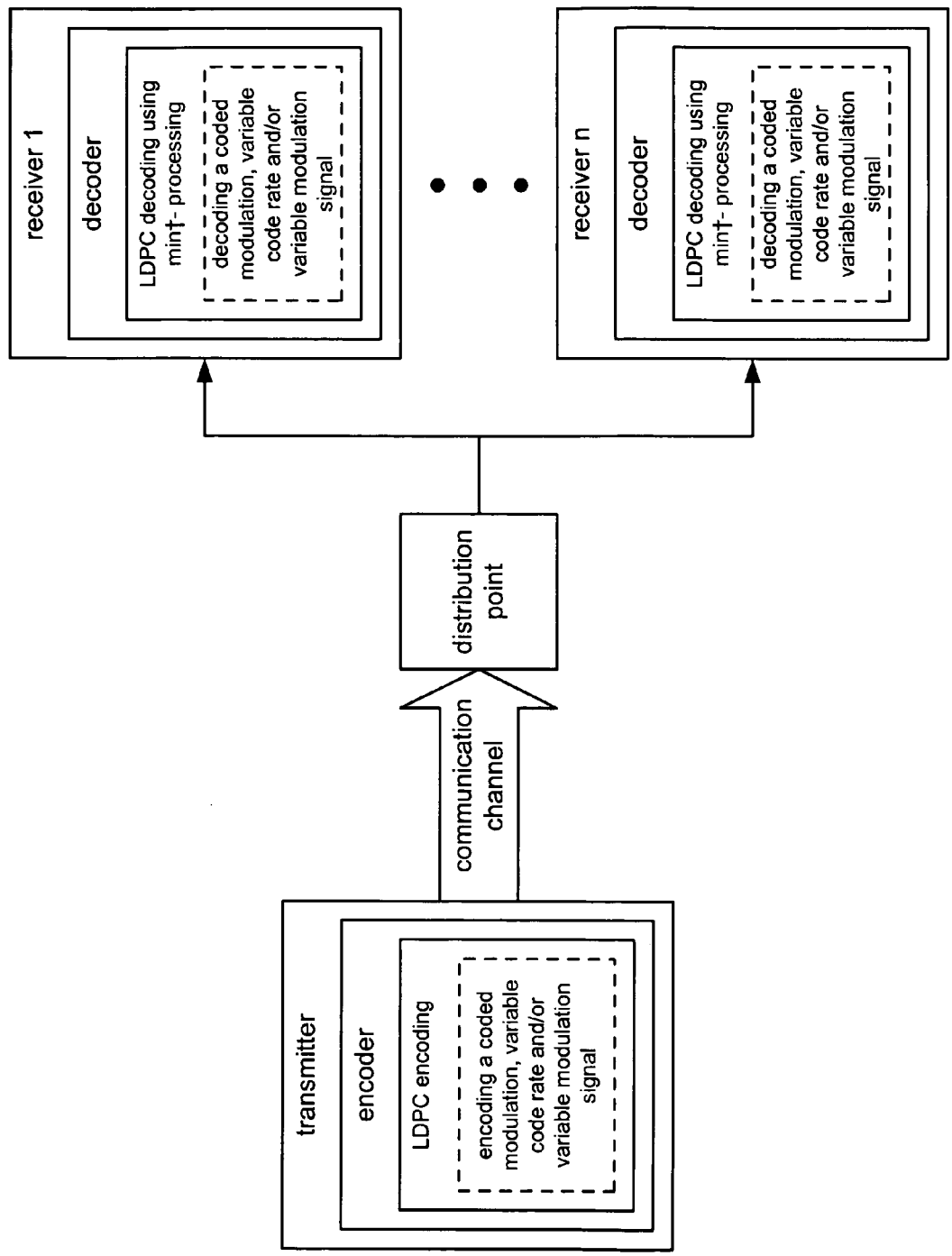
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, . . . , n via a uni-directional communication channel. The uni-directional communication channel may be a wireline (or wired) communication channel or a wireless communication channel without departing from the scope and spirit of the invention. The wired media by which the communication channel may be implemented are varied, including coaxial cable, fiber-optic cabling, and copper cabling, among other types of "wiring." Similarly, the wireless manners in which the communication channel may be implemented are varied, including satellite communication, cellular communication, microwave communication, and radio communication, among other types of wireless communication.

A distribution point is employed within the one to many communication system to provide the appropriate communication to the receivers 1, . . . , and n. In certain embodiments, the receivers 1, . . . , and n each receive the same communication and individually discern which portion of the total communication is intended for them.

The transmitter is operable to encode information (using an encoder) in a manner in accordance with the functionality and/or processing of at least some of the various aspects of the invention to assist in generating a signal that is to be launched into the communication channel coupling the transmitter and the receivers 1, . . . , and n. Each of the receivers 1, . . . , and n is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 12:
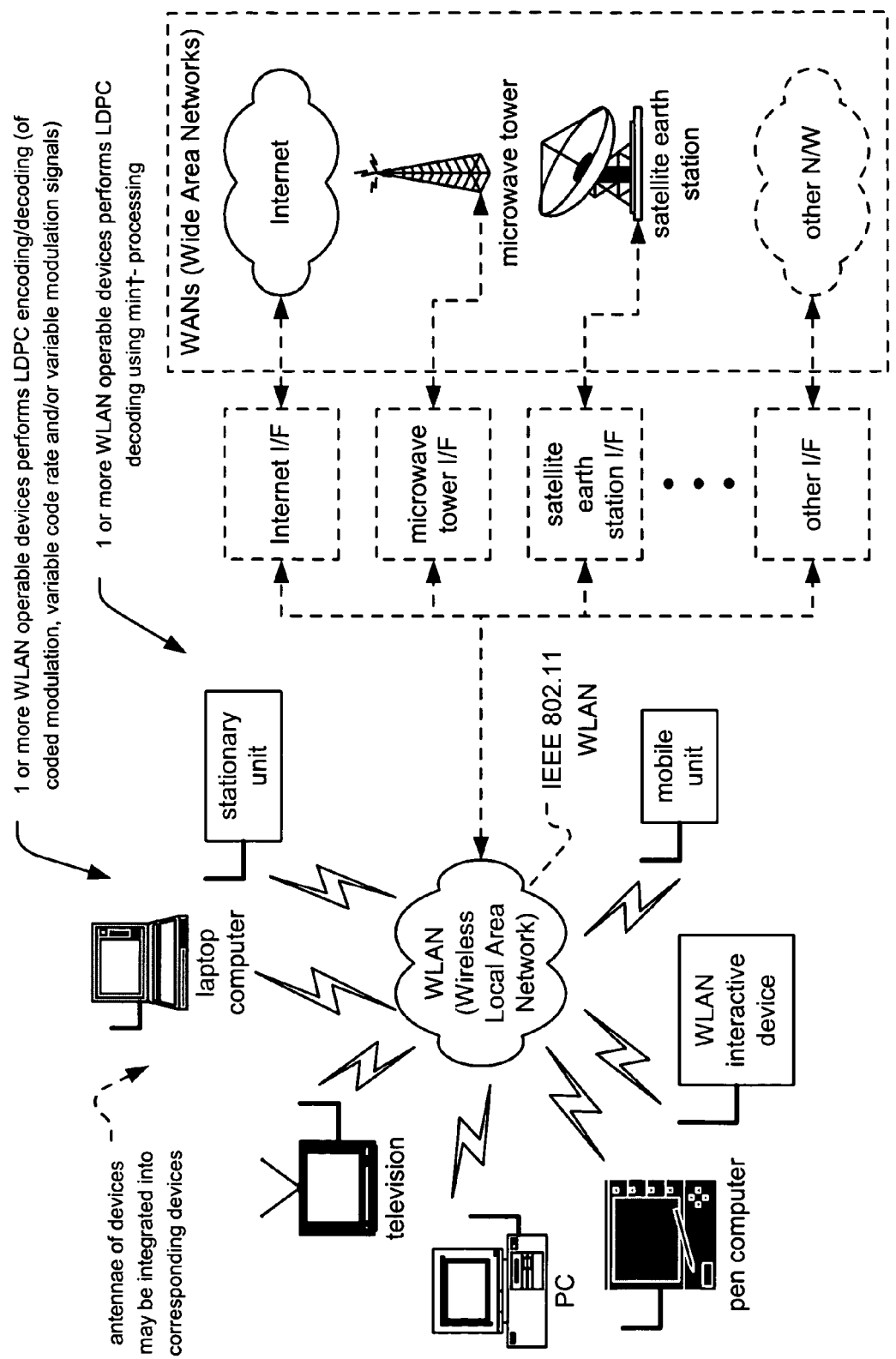
FIG. 12 is a diagram illustrating an embodiment of a WLAN (Wireless Local Area Network) communication system that may be implemented according to the invention.

FIG. 12 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. Again, as within other embodiments that includes bi-directional communication devices having an encoder and a decoder, the encoder of any of these various WLAN interactive devices may be implemented to encode information (using its corresponding encoder) in a manner in accordance with the functionality and/or processing of at least some of the various aspects of the invention to assist in generating a signal that is to be launched into the communication channel that couples to another WLAN interactive device. The decoder of any of the various WLAN interactive devices may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an 802.11 operable device may be an 802.11a operable device, an 802.11b operable device, or an 802.11g operable device. Sometimes, an IEEE 802.11 operable device is operable to communicate according to more than one of the standards (e.g., both 802.11a and 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the 802.11b standard. The 802.11a standard uses a different frame format with OFDM (Orthogonal Frequency Division Multiplexing) to transmit at rates up to 54 Mbps with carrier frequencies in the 5 GHz range. The 802.11g specification allows for such OFDM frames to coexist with DSSS/CCK frames at 2.4 GHz.

Figure 13:
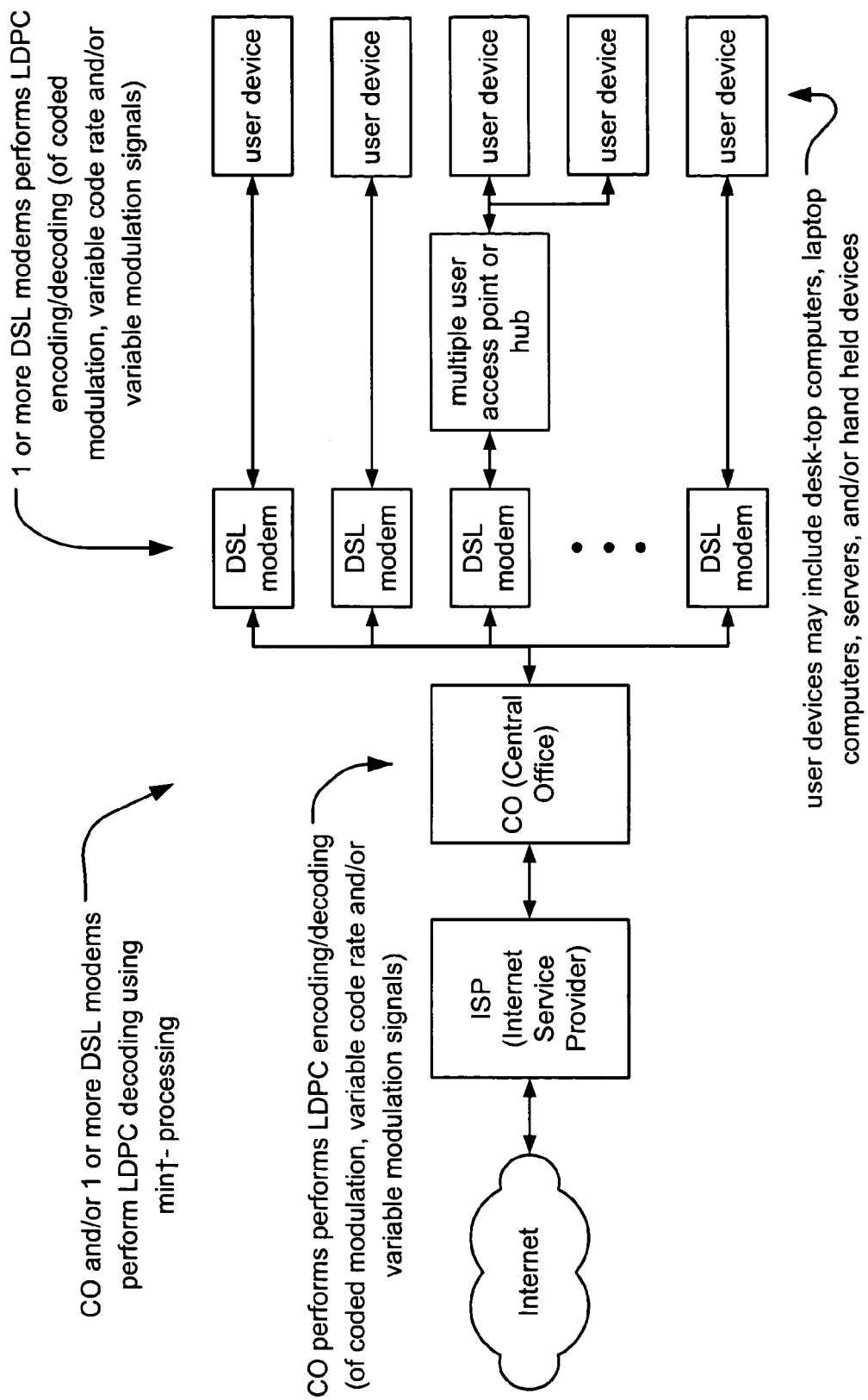
FIG. 13 is a diagram illustrating an embodiment of a DSL (Digital Subscriber Line) communication system that may be implemented according to the invention.

FIG. 13 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephone services company. The CO may also allow for the providing of telephone services to one or more subscribers. However, the CO may also be implemented to allow interfacing of Internet traffic to and from one or more users (whose interactive devices are shown as user devices). These user devices may be any device within a wide variety of devices including desk-top computers, laptop computers, servers, and/or hand held devices without departing from the scope and spirit of the invention. Any of these user devices may be wired or wireless type devices as well. Each of the user devices is operably coupled to the CO via a DSL modem. The DSL modem may also be communicatively coupled to a multiple user access point or hub to allow more than one user device to access the Internet.

The CO and the various DSL modems may also be implemented to include an encoder and a decoder to allow bidirectional communication therein. For example, the CO is operable to encode and decode data when communicating to and from the various DSL modems and the ISP. Similarly, each of the various DSL modems is operable to encode and decode data when communicating to and from the CO and its respective one or more user devices.

As within other embodiments that employ an encoder and a decoder, the encoder of any of the CO and the various DSL modems may be implemented to encode information (using its corresponding encoder) in a manner in accordance with the functionality and/or processing of at least some of the various aspects of the invention to assist in generating a signal that is to be launched into the communication channel coupling the CO and the various DSL modems. The decoder of any of the CO and the various DSL modems may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 14:
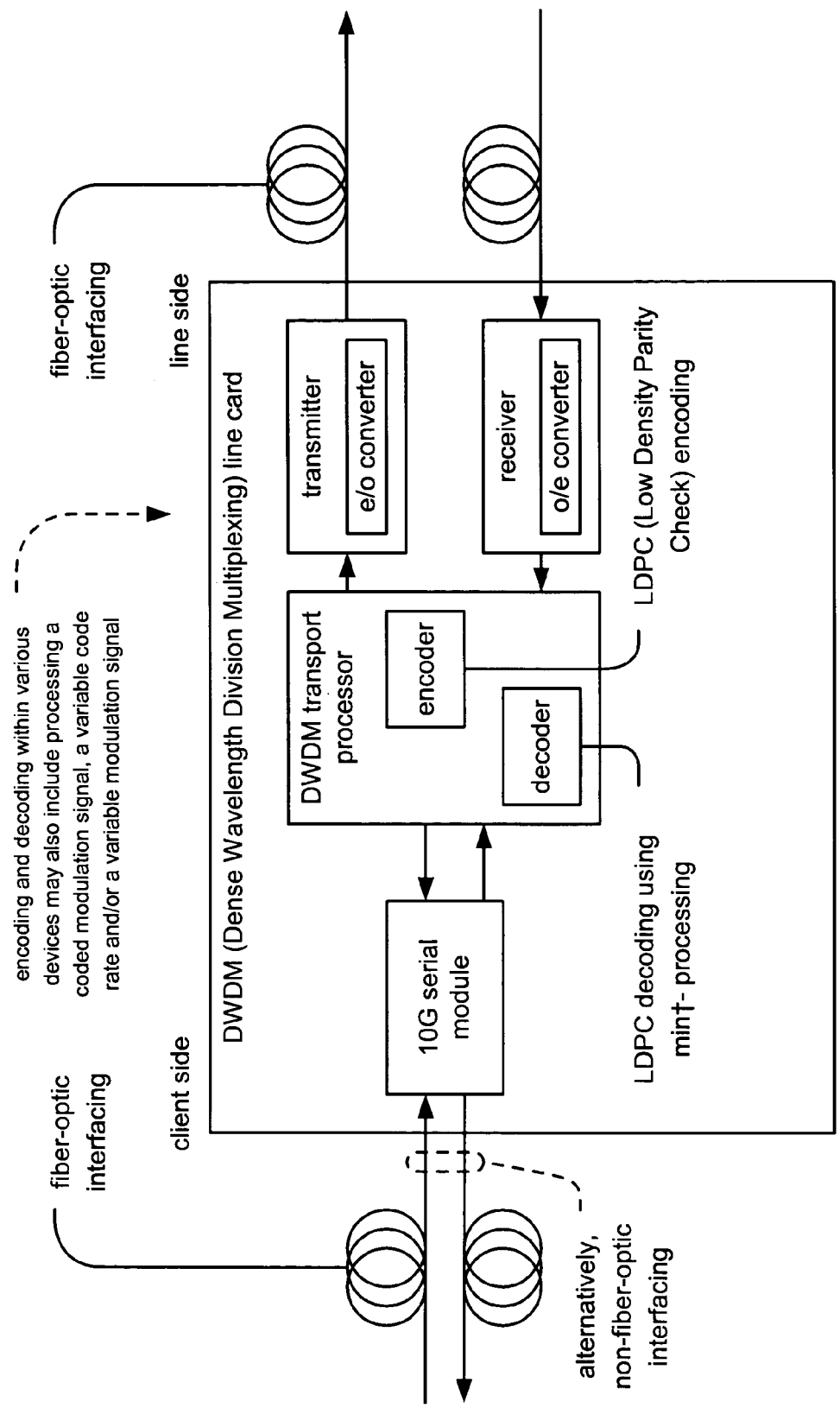
FIG. 14 is a system diagram illustrating an embodiment of a fiber-optic communication system that is built according to the invention.

FIG. 14 is a system diagram illustrating an embodiment of a fiber-optic communication system that is built according to the invention. The fiber-optic communication system includes a DWDM (Dense Wavelength Division Multiplexing, within the context of fiber optic communications) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantages of DWDM can be summarized as follows:

1. The transparency of DWDM: Because DWDM is a PHY (physical layer) architecture, it can transparently support both TDM (Time Division Multiplexing) and data formats such as ATM (Asynchronous Transfer Mode), Gigabit Ethernet, ESCON (Enterprise System CONnection), and Fibre Channel with open interfaces over a common physical layer.

2. The scalability of DWDM: DWDM can leverage the abundance of dark fiber in many metropolitan area and enterprise networks to quickly meet demand for capacity on point-to-point links and on spans of existing SONET/SDH (Synchronous Optical NETwork)/(Synchronous Digital Hierarchy) rings.

3. The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10 G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder is operable to encode information in a manner in accordance with the functionality and/or processing of at least some of the various aspects of the invention to assist in generating a signal that is to be launched into the communication channel to which the DWDM line card is coupled. The decoder is operable to decode a signal received from the communication channel in a manner in accordance with the functionality and/or processing of at least some of the various aspects of the invention. This diagram shows yet another embodiment where one or more of the various aspects of the invention may be found.

Figure 15:
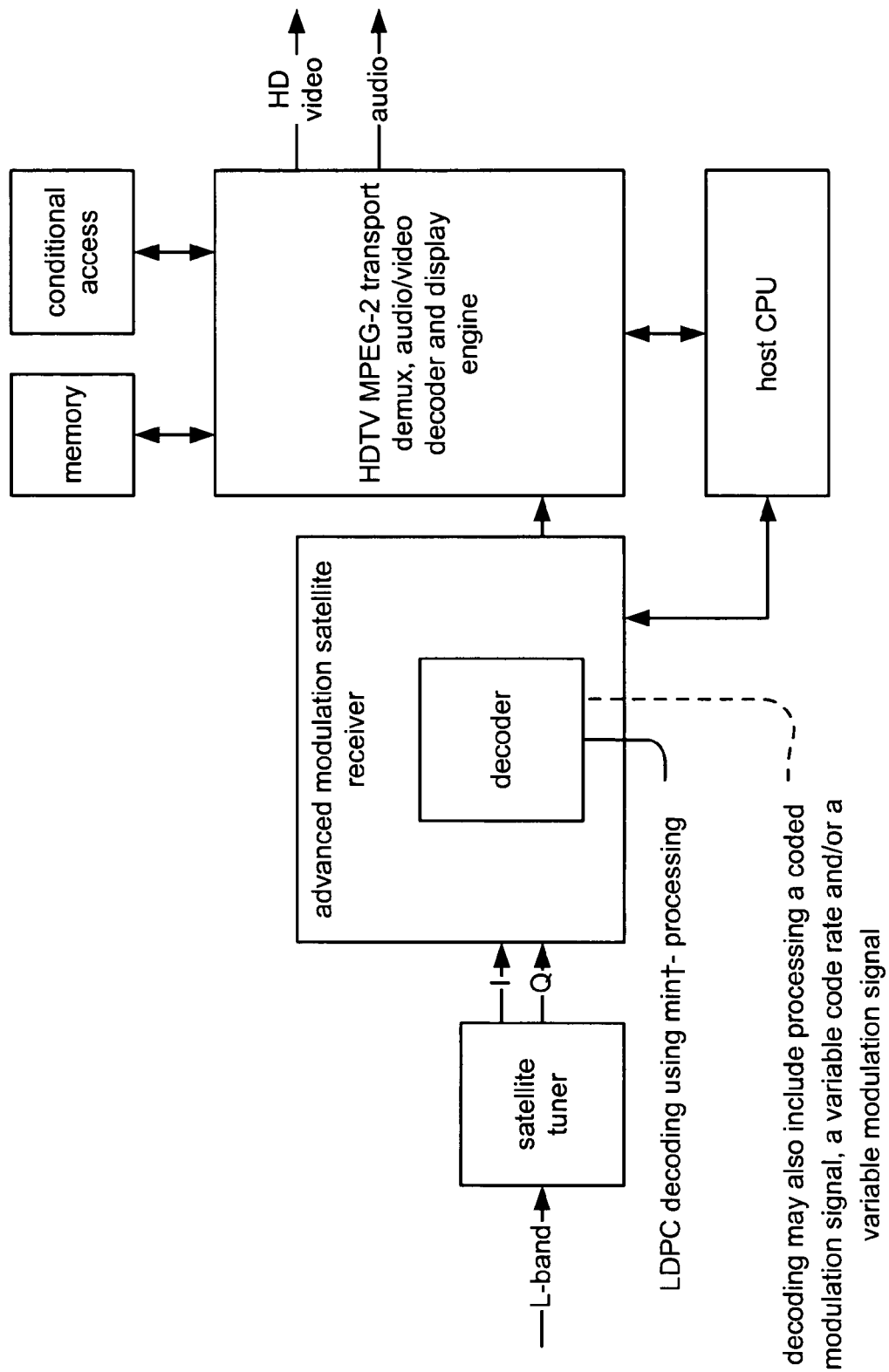
FIG. 15 is a system diagram illustrating an embodiment of a satellite receiver STB (Set Top Box) system that is built according to the invention.

FIG. 15 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band (e.g., within the frequency range between 390–1550 MHz (Mega-Hertz) in the ultra-high radio frequency range). The satellite tuner extracts I, Q (In-phase, Quadrature) components from a signal received from the L-band and provides them to the advanced modulation satellite receiver. The advanced modulation satellite receiver includes a decoder.

As within other embodiments that employ a decoder, the decoder is operable to decode a signal received from a communication channel without which the advanced modulation satellite receiver is coupled in a manner in accordance with the functionality and/or processing of at least some of the various aspects of the invention. This diagram shows yet another embodiment where one or more of the various aspects of the invention may be found.

The advanced modulation satellite receiver may be implemented to communicatively couple to an HDTV MPEG-2 (Motion Picture Expert Group, level 2) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that operates in a manner in accordance with the functionality and/or processing of at least some of the various aspects of the invention. The advanced modulation satellite receiver is operable to receive communication provided to it from a transmitter device that includes an encoder as well.

In addition, several of the following Figures describe particular embodiments that may be used to implement some of the various aspects of the min†– processing (min-dagger minus processing) that can be employed within LDPC decoding processing according to the invention. Several details of these various aspects are provided below. Initially, a general description of LDPC codes is provided.

Figure 16:
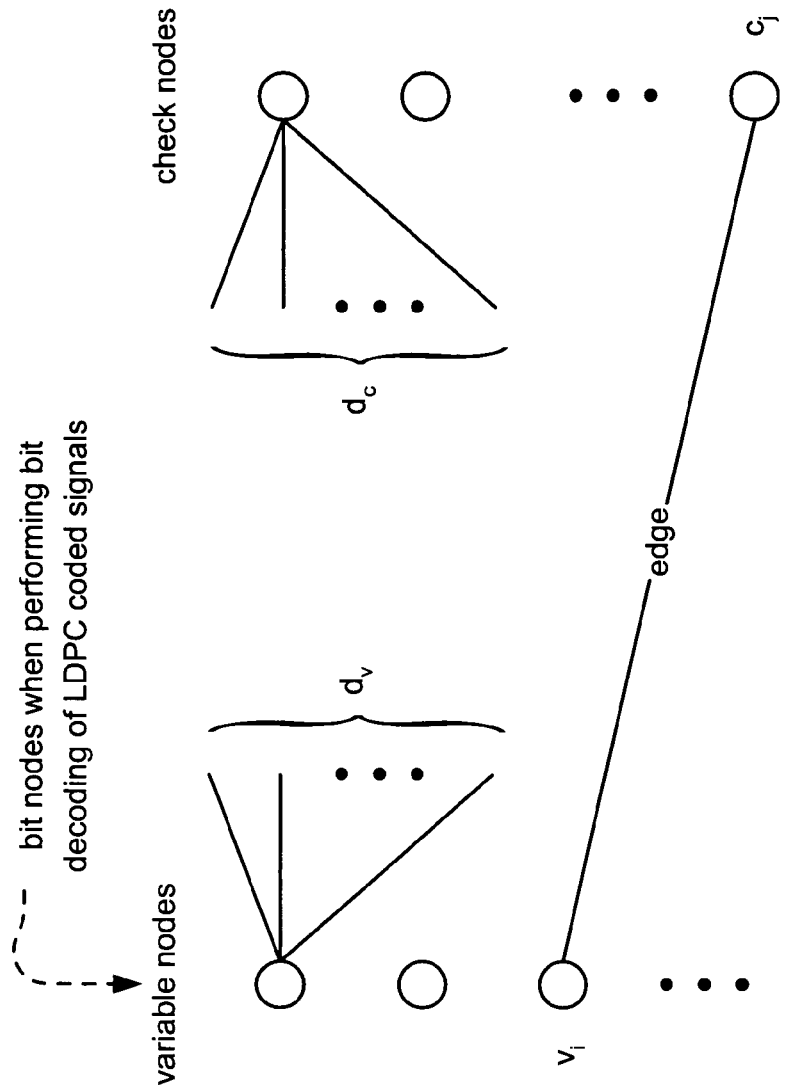
FIG. 16 is a diagram illustrating an embodiment of an LDPC (Low Density Parity Check) code bipartite graph.

FIG. 16 is a diagram illustrating an embodiment of an LDPC (Low Density Parity Check) code bipartite graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N. If every column of the matrix has $d_v$ 1's, and every row of the matrix has $d_c$ 1's, then this code is referred to as a $(d_v, d_c)$ regular LDPC code. For example, a regular (4,72) LDPC code would be viewed as being a, code whose binary parity check matrix would have 4 1's in every column and 72 1's in every row. These regular LDPC codes were introduced in R. Gallager, *Low-Density Parity-Check Codes*, Cambridge, Mass.: MIT Press, 1963.

A regular LDPC code can be represented as a bipartite graph by its parity check matrix with left side nodes representing variable of the code bits, and the right side nodes representing check equations. The bipartite graph of the code defined by H may be defined by N variable nodes and M check nodes. Every variable node of the N variable nodes has exactly $d_v$ edges connecting this node to one or more of the check nodes (within the M check nodes). This number of $d_v$ edges may be referred to as the degree of a variable node. Analogously, every check node of the M check nodes has exactly $d_c$ edges connecting this node to one or more of the variable nodes. This number of $d_c$ edges may be referred to as the degree of a check node.

An edge between a variable node $v_i$ and check node $c_j$ may be defined by $e=(i,j)$. However, on the other hand, given an edge $e=(i,j)$, the nodes of the edge may alternatively be denoted as by $e=(v(e),c(e))$. Given a variable node $v_i$, one may define the set of edges emitting from the node $v_i$ by $E_v(i)=\{e|v(e)=i\}$. Given a check node $c_j$, one may define the set of edges emitting from the node $c_j$ by $E_c(j)=\{e|c(e)=j\}$. Continuing on, the derivative result will be $|E_v(i)|=d_v$ and $|E_c(j)|=d_c$.

An irregular LDPC code may also described using a bipartite graph. However, the degree of each set of nodes within an irregular LDPC code may be chosen according to some distribution. Therefore, for two different variable nodes, $v_{i_1}$, and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby. M. Mitzenmacher, M. A. Shokrollahi, D. A. Spielman. and V. Stemann, "Practical Loss-Resilient Codes," *Proc. 29th Symp. on Theory of Computing*, 1997, pp. 150–159.

In general, with a graph of an LDPC code, the parameters of an LDPC code can be defined by a degree of distribution, as described within M. Lugy, et al. (referenced above) and also within T. J. Richardson and R. L. Urbanke, "The capacity of low-density parity-check code under message-passing decoding," *IEEE Trans. Inform. Theory*, Vol. 47, pp. 599–618, February 2001. This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that the invention is also operable to accommodate both regular LDPC codes and irregular LDPC codes.

The LLR (Log-Likelihood Ratio) decoding of LDPC codes may be described as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code that is use to check the parity of the received vector. The LLR is the logarithm of the ratio of these two calculated probabilities. This LLR will give a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, with the sent signal having the form of $((-1)^{v_0i}, \ldots, (-1)^{v_{N-1}})$, then the metrics of the channel may be defined as $p(y_i|v_i=0)$, $p(y_i|v_i=1), i=0, \ldots, N-1$. The LLR of a metric will then be defined as follows:

$$L_{metric}(i) = \ln\frac{p(y_i|v_i = 0)}{p(y_i|v_i = 1)}$$

For every variable node $v_i$, its LLR information value will then be defined as follows:

$$\ln\frac{p(v_i = 0|y_i)}{p(v_i = 1|y_i)} = L_{metric}(i) + \ln\frac{p(v_i = 0)}{p(v_i = 1)}$$

Since the variable node, $v_i$, is in a codeword, then the value of the ratio of these, $$\ln\frac{p(v_i = 0)}{p(v_i = 1)},$$

may be replaced by the following $$\ln\frac{p(v_i = 0, vH^T = 0|y)}{p(v_i = 1, vH^T = 0|y)} = \sum_{(i,j)\in E_v(i)} \ln\frac{p(v_i = 0, vh_j^T = 0|y)}{p(v_i = 1, vh_j^T = 0|y)}$$

where $E_v(i)$ is a set of edges starting with $v_i$ as defined above.

When performing the BP (Belief Propagation) decoding approach in this context, then the value of $$\ln\frac{p(v_i = 0, vh_j^T = 0|y)}{p(v_i = 1, vh_j^T = 0|y)}$$

may be replaced by the following relationship $$L_{check}(i, j) = \ln\frac{p\left(\sum_{e\in E_c(j)\setminus\{(i,j)\}} v_{v(e)} = 0\Big|y\right)}{p\left(\sum_{e\in E_c(j)\setminus\{(i,j)\}} v_{v(e)} = 1\Big|y\right)}$$

$L_{check}(i,j)$ is called the EXT (extrinsic) information of the check node $c_j$ with respect to the edge $(i,j)$. In addition, it is noted that $e\in E_c(j)\setminus\{(i,j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual bit values within a received vector. Also in a BP approach, then the extrinsic information of the variable node $v_i$ with respect to the edge (i,j) may be defined as follows:

$$L_{var}(i, j) = L_{metric}(i) + \sum_{(i,k) \in E_v(i) \setminus \{(i,j)\}} L_{check}(i, k)$$

The functionality of a BP LLR decoder that is operable to decode an LDPC code as described below within various embodiments.

Figure 17:
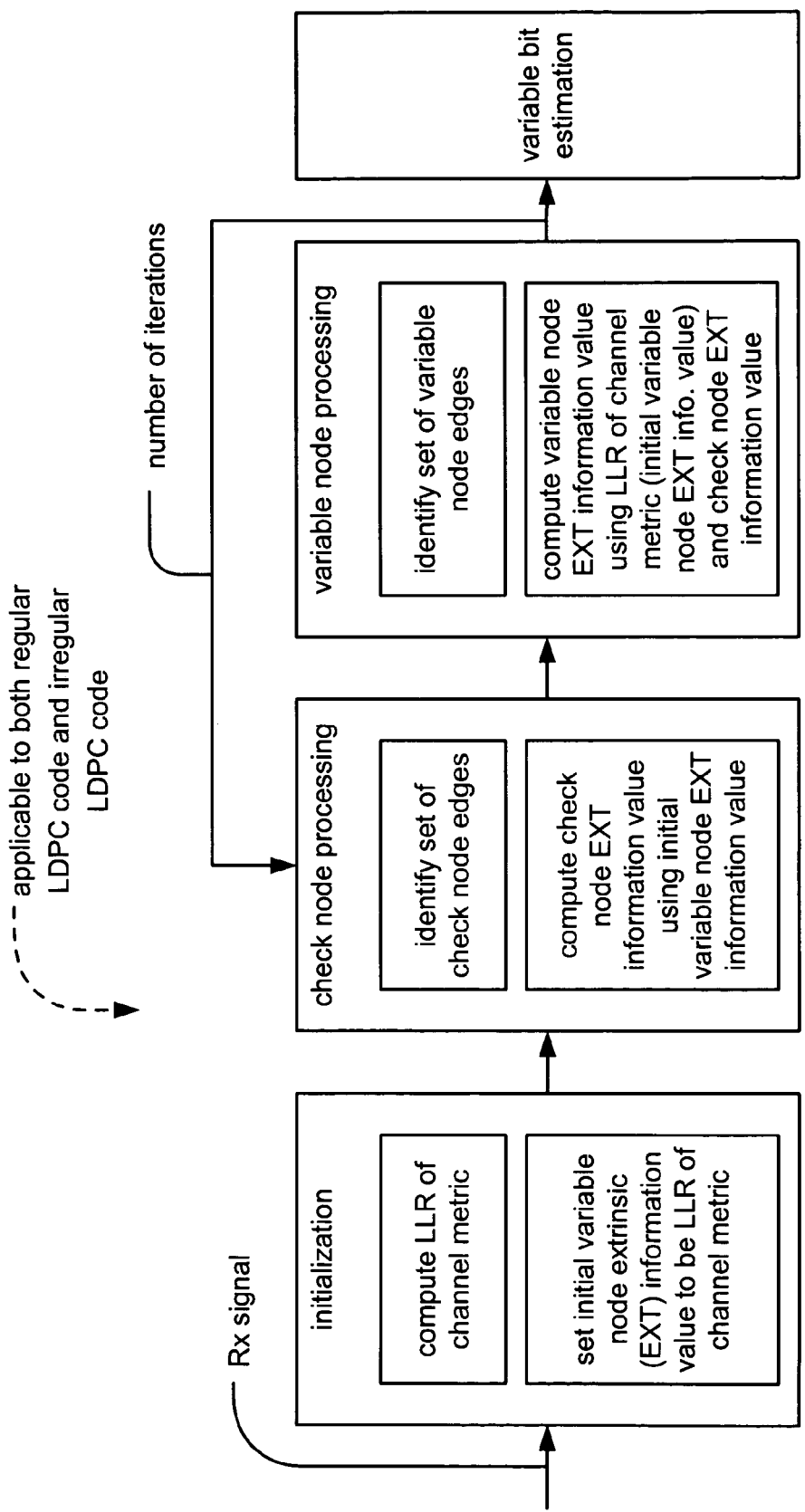
FIG. 17 is a functional block diagram illustrating an embodiment of LDPC (Low Density Parity Check) code LLR (Log-Likelihood Ratio) decoding functionality that is arranged according to the invention.

FIG. 17 is a functional block diagram illustrating an embodiment of LDPC (Low Density Parity Check) code LLR (Log-Likelihood Ratio) decoding functionality that is arranged according to the invention. The LLR decoding functionality includes a number of functional blocks that operate on a received signal (shown as Rx signal). The received signal is provided by an initialization functional block to establish the initial conditions of the decoding process, then to a check node processing functional block and on to a variable node processing functional block for determining the extrinsic information for the check and variable nodes, respectively, and finally to a variable bit estimation functional block where the actual best estimation of one or more bits within the received signal are made.

The initialization functional block computes the LLR of the channel metric over which the received signal has been transmitted. The initialization involves computing the LLR of the channel metric (e.g., $L_{metric}(i)$). In addition, the initialization functional block includes setting the initial variable node extrinsic value ($L_{var}^n(e)$) to be the LLR of the channel metric ($L_{metric}(i)$). This may be expressed mathematically as follows:

$$L_{var}^n(e) = L_{metric}(v(e)) \text{ for all the edges } e \text{ and } n=0.$$

The check node processing functional block involves identifying the set of all of the check node edges according to the bipartite graph shown and described above. This may be shown mathematically as follows:

For every check node $c_i, i=0, \ldots, M-1$, we define the check node edges as $E_c(i) = \{e_0, \ldots, e_{d_c-1}\}$.

In addition, the check node processing functional block also performs computation of the check node extrinsic information value ($L_{check}^n(e_j)$) using the initial variable node extrinsic value $$(L_{var}^{n-1}(e_k)).$$

The variable node processing functional block involves identifying the set of all variable node edges according to the bipartite graph shown and described above.

This may be shown mathematically as follows:

For every variable node $v_i, i=0, \ldots, N-1$, we define the variable node edges as $E_v(i) = \{e_0, \ldots, e_{d_v-1}\}$.

In addition, a variable node extrinsic information value is computed using an LLR of channel metric and a check node extrinsic information value. This may be shown mathematically as follows:

Compute: $L_v^n(i) = L_{metric}(i) + \sum_{k=0}^{d_v-1} L_{check}^n(e_k)$

Compute: $L_{var}^n(e_j) = L_v^n - L_{check}^n(e_j), e_j \in E_v(i)$

In accordance with the iterative decoding described herein, multiple decoding iterations may be performed by feeding back the results provided by the variable node processing functional block to the check node processing functional block.

At the last iteration, a best estimate of a variable bit contained within the received signal may be made by the variable bit estimation functional block. The best estimate is made using the variable $L_v^n(i)$. When $L_v^n(i)$ is greater than or equal to zero, then the best estimate of a variable bit is made as being a value of 0; when $L_v^n(i)$ is less than zero, then the best estimate of a variable bit is made as being a value of 1.

$$v_i = \begin{cases} 0 & L_v^n(i) \geq 0 \\ 1, & L_v^n(i) < 0 \end{cases}$$

Alternatively, a reverse analysis may be performed if desired in certain embodiments.

$$v_i = \begin{cases} 1 & L_v^n(i) \geq 0 \\ 0, & L_v^n(i) < 0 \end{cases}$$

The prior art approaches of performing LDPC decoding typically prove to be very computationally intensive. The invention provides several embodiments that may significantly reduce the total number of operations that need be performed as well as the corresponding memory required to support those operations. This can result in a great deal of processing savings as well as speeding up of the decoding process. Moreover, given that the total number of processing operations may be reduced, a device having fewer functional blocks (e.g., and therefore occupying less area) may also be employed. The processing within the check node processing functional block shown and described above may be performed using any number of computational optimizations.

The following description is used to show the basic computations that need to be performed to calculate the check node extrinsic information value that is used in decoding a variable bit within a received signal.

The basic computation may be described as beginning with the random variables, $v_1, v_2, \ldots, v_k$ having values in $\{0,1\}$ (zero or one) and with the probability $p_i(0)$ and $p_i(1), i=1,2, \ldots, k$. The denotation of the logarithmic ratio of these probabilities is shown below:

$$L(v_i) = \ln[p_i(1)/p_i(0)], i=1,2, \ldots, k$$

It may also be shown, as by the authors in J. Hagenauer, E. Offer and L. Papke, "Iterative decoding of binary block and convolutional codes," *IEEE Trans. Inform. Theory*, Vol. 42, No. 2, March 1996, pp. 429–445, that the extrinsic information value for a sum of random variables may be shown as follows:

$$L(v_1 + v_2) = \ln \frac{p(v_1 + v_2 = 1)}{p(v_1 + v_2 = 0)} = \ln \frac{1 + \exp(L(v_1) + L(v_2))}{\exp(L(v_1)) + \exp(L(v_2))}$$

Using this relationship, the following relationship may be made.

$$L\left(\sum_{i=1}^{k} v_i\right) = \ln \frac{p\left(\sum_{i=1}^{k} v_i = 1\right)}{p\left(\sum_{i=1}^{k} v_i = 0\right)} = L\left(\left[\sum_{i=1}^{k} v_i\right] + v_k\right) \quad \text{EQ 1}$$

Continuing on with LDPC decoding, there are essentially two steps that are performed within each decoding iteration of an LDPC coded decoder. One step is using the bit information to update the edge information (e.g., a bit-to-check step: B2C step). The other step is using the check information to update the edge information (e.g., a check-to-bit step: C2B step). Within this description, the focus is on the B2C step, namely, the step involving using the bit information to update the edge information.

This iterative decoding processing of LDPC codes may be viewed by considering a bit, b, that connotes the set of edges, $e_0, e_1, \ldots, e_m$ (or $e_i, i=0, \ldots, m$). By this, the LLR of the set of edges passed to the variable node processing functional block (e.g., the bit, b, node processing block in this instance) from the results of the C2B step (performed by the check node processing functional block) of the previous decoding iteration may be represented as follows:

$$L_c(e_i), i=0, \ldots, m.$$

Within the variable node processing functional block (which performs the B2C step), the bit information is used to update the edge information. This updated edge information, $L_b(e_i), i=0, \ldots, m$, of $e_i, i=0, \ldots, m$ may be computed as follows:

$$L_b(e_i) = \left[\prod_{j \neq i} \operatorname{sign}(L_c(e_j))\right] \cdot f(|L_c(e_0)|, \ldots, |L_c(e_{i-1})|, |L_c(e_{i+1})|, \ldots, |L_c(e_m)|) \quad \text{EQ 2}$$

This above computation of the updated edge information, $L_b(e_i)$, may be performed using the following function:

$$f(x, y) = \ln\left(\frac{1 + \exp(x+y)}{\exp(x) + \exp(y)}\right) \quad \text{EQ 3}$$

This function may be further simplified as follows:

$$f(x, y) = \operatorname{sign}(x)\operatorname{sign}(y)\ln\left(\frac{1 + \exp(|x|+|y|)}{\exp(|x|) + \exp(|y|)}\right); \quad \text{EQ 4}$$

$$\text{where } \operatorname{sign}(x) = \begin{cases} 1, & x \geq 0 \\ -1, & x < 0 \end{cases}.$$

Since $|x|,|y| \geq 0$, we have $\exp(|x|)(\exp(|y|)-1) \geq (\exp(|y|)-1)$, and therefore the following relationship may be made:

$$\ln\left(\frac{1 + \exp(|x|+|y|)}{\exp(|x|) + \exp(|y|)}\right) \geq 0 \quad \text{EQ 5}$$

By using the Equations 4 and 5 above, the following two relationships may be made.

$$\operatorname{sign}(f(x,y)) = \operatorname{sign}(x)\operatorname{sign}(y)$$

$$|f(x,y)| = f(|x|,|y|)$$

Continuing on, the following relationships may be achieved:

$$f(x,y) = \operatorname{sign}(x)\operatorname{sign}(y) f(|x|,|y|) \quad \text{EQ 6}$$

To generalize this function to functions having more variable, the following relationship may be made:

$$f(x_1, x_2, \ldots, x_k) = f(f(x_1, \ldots, x_{k-1}), x_k) \quad \text{EQ 7}$$

In addition, the following relationships may be achieved as well:

$$f(x_1, \ldots, x_k) = \left(\prod_{i=1}^{n} \operatorname{sign}(x_i)\right) f(|x_1|, \ldots, |x_k|) \quad \text{EQ 8}$$

The following two relationships may then be employed when performing the decoding of an LDPC code.

$$\operatorname{sign}(f(x_1, \ldots, x_n)) = \left(\prod_{i=1}^{n} \operatorname{sign}(x_i)\right),$$

$$|f(x_1, \ldots, x_k)| = f(|x_1|, \ldots, |x_k|)$$

A brief proof of the preceding relationship is shown below. In the earlier case, the value of k was 2. Continuing on, if we operate on the supposition that EQ 8 is in fact true when k=n−1. If we use Equations 6 and 7, and by also using the following relationship:

$$(f(x_1, \ldots, x_n) = (\operatorname{sign}(f(x_1, \ldots, x_{n-1})\operatorname{sign}(x_n)f(\mid f(x_1, \ldots, x_{n-1})|, |x_n|)$$

$$= \left[\prod_{i=1}^{k} \operatorname{sign}(x_i)\right] f(f(|x_1|, \ldots, |x_{n-1}|, |x_n|)$$

$$= \left[\prod_{i=1}^{k} \operatorname{sign}(x_i)\right] f(|x_1|, \ldots, |x_n|)]$$

Now, the L function defined above within the EQ 1 may then be described by the relationship shown below.

$$L\left(\sum_{i=1}^{k} v_i\right) = \quad \text{EQ 9}$$

$$f(L(v_1), \ldots, L(v_k)) = \left[\prod_{i=1}^{k} \operatorname{sign}(L(v_i))\right] f(|L(v_1)|, \ldots, |L(v_k)|)$$

A common calculation that is performed when decoding an LDPC signal includes the computation and approximation of the function: $f(|x|,|y|)$.

From the definition of $f(|x|,|y|)$, the following relationship may be made.

$$f(|x|, |y|) = \ln\frac{1 + \exp(-(|x|, |y|))}{\exp(-|x|) + \exp(-|y|)} \quad \text{EQ 10}$$

$$f(|x|, |y|) = -\ln(\exp(-|x|) + \exp(-|y|) + \ln(1 + \exp(-(|x|, |y|)))$$

$$f(|x|, |y|) = \min(|x|, |y|) + \ln\left[\frac{1 + \exp(-(|x|, |y|))}{1 + \exp(-||x|, |y||)}\right] = \min^{**}(|x|, |y|)$$

The right side of the last equation may be denoted by as the min operator, the min function, the processing performed by the min operator, or more specifically shown as min(|x|,|y|). The min* function also is provided here for comparison to this min** function.

For any real values x and y, the calculation of min* may be described as below. The min* calculation includes finding an actual minimum and also a natural log base e ($\log_e = \ln$) correction factor.

$$\min^*(x,y) = -\ln(e^{-x} + e^{-y})$$

In general, we define $\min^*(x_1, \ldots, x_N) = \min^*(\min^*((x_1, \ldots, x_{N-1})x_N)$. Using induction, one can prove the following relationship:

$$\min^*(x_1, \ldots, x_N) = -\ln(e^{-x_1} + e^{-x_2} + \ldots + e^{-x_N})$$

From the min* relationship shown above, we have $$\min^*(x, y) = \begin{cases} -\ln(e^{-x}(1 + e^{x-y})), & x \le y \\ -\ln(e^{-y}(1 + e^{y-x})), & x > y \end{cases}$$

$$= \min(x, y) - \ln(1 + e^{-|x-y|})$$

This equation may also be simplified as shown below:

$$\min^*(x,y) = \min(x,y) - \ln(1 + e^{-|x-y|})$$

It is noted that the min** function also has some similarities to the min* function. For example, similar to the definition of min*, part of the min** function, shown as $$\ln\left[\frac{1 + \exp(-(|x|, |y|))}{1 + \exp(-\|x|, |y\|)}\right],$$

may be considered as a natural log base e ($\log_e = \ln$) correction factor that only needs a ROM (Read Only Memory), or some other memory storage device, to store some possible values of that portion. For example, the inventors have implemented such logarithmic type correction factors using ROM and other memory storage techniques for many years. Even more recently, others have also tried to employ such memory storage techniques for their respective logarithmic correction factors; one relatively recent example of how such storage may be performed may be found in E. Eleftheriou, T. Mittelholzer and A. Dholakia, "Reduced-complexity decoding algorithm for low-density parity-check codes," *IEE Electronic Letters*, Vol. 37, pp. 102–104, January 2001.

Moreover, we denote $\min^{}(x_1, \ldots, x_n) = \min^{}(\min^{**}((x_1, \ldots, x_{n-1})x_n))$ Using this relationship, then the relationship of EQ 9 may be described as the following relationship:

$$L\left(\sum_{i=1}^{k} v_i\right) = \left[\prod_{i=1}^{k} \text{sign}(L(u_i))\right] \min^{**}\{|L(v_i)|, \ldots, |L(v_k)|\}$$

In taking the first part of the right side of the second equation in EQ 10, the authors of J. Hagenauer, E. Offer, and L. Papke, "Iterative decoding of binary block and convolutional codes," *IEEE Trans. Inform. Theory*, Vol. 42, No. 2 March 1996, pp. 429–445 had suggested to use the approximation $f(|x|,|y|) \approx \min(|x|,|y|)$.

With this approximation, the EQ 9 may then be described as follows:

$$L\left(\sum_{i=1}^{k} v_i\right) \approx \left[\prod_{i=1}^{k} \text{sign}(L(u_i))\right] \min\{|L(v_i)|, \ldots, |L(v_k)|\}$$

However, this proposed solution is a very significant compromise of the accuracy of the calculation. As a result of such a significant compromise in accuracy, a great loss in performance is undesirably realized using such an approach. A much better approximation that includes the appropriate logarithmic correction may be employed as follows:

Approximate f(|x|,|y|) as follows:

$$f(|x|,|y|) \approx \min^*(|x|,|y|) = \min(|x|,|y|) - \ln(1 + e^{-\||x|-|y|\|})$$

It is especially noted here that this approximation shown above does not result in any performance loss. This way, a simplification may be made in the operations performed without any performance loss thereby achieving a more efficient implementation.

With this approximation, the relationship of the EQ 9 will then become $$L\left(\sum_{i=1}^{k} v_i\right) = \left[\prod_{i=1}^{k} \text{sign}(L(u_i))\right] \min^*\{|L(v_i)|, \ldots, |L(v_k)|\}$$

The following description employs the various relationships described above in performing LDPC decoding. The application of the EQ 9 may be made to an LLR decoder. In doing so, the value of $L(v_i)$ is replaced by $$L_{var}^{n-1}(i, j)$$

with respect to the edge (i,j). In doing so, then the extrinsic information value of the check node with respect to the edge (i,j), shown as $L_{check}^n(i,j)$, will become:

$$L_{check}^n(i, j) = \left[\prod_{e \in E_c(j) \setminus \{(i,j)\}} \text{sign}(L_{var}^{n-1}(e))\right] \quad \text{EQ 11}$$

$$f(\{|L_{var}^{n-1}(e)| | e \in E_c(j) \setminus \{(i, j)\}\})$$

It is noted here that the function, f, in the above EQ 11 may appropriately be implemented as min* processing, min** processing, or min† processing. That is to say, the particular calculations employed to update these edges with respect to the check nodes, $L_{check}^n(i,j)$, may be performed using any one of the various processing techniques described herein for the function, f.

To update all of the edges emitted from a bit, b, (with m+1 edges), then a total number of m(m−1) min* processing operations need to be performed. For example, m(m−1) operations of the processing of the min* operator (e.g., min*(x,y)) will need to be performed. Performing such a large number of computations can prove to be very inefficient in implementation in hardware. For example, this approach may not be the most efficient from an implementation in hardware point of view since this significant number of operations can result in either increased latency or increased area of the device. In order to develop a more efficient, the min*− operator (or min*− processing) may be employed. The min*− processing operation is provided as follows:

$$\min^*-(x,y)=\min^*(x,y)-\ln(1-\exp(-|x-y|)) \quad \text{EQ 12}$$

When breaking down the min* operation into min*+ and min*− (the inverse of min*+) operations, min* operation itself, defined above, is now renamed as being a min*+ operation. Furthermore, the following definition of the min*− operation may be shown on any real values x and y such that x<y as follows:

$$\min^*-(x,y)=-\ln(e^{-x}-e^{-y})$$

Then, we have the min*− operator as shown above within EQ 12 and follows:

$$\min^*-(x,y)=\min(x,y)-\ln(1-e^{-|x-y|}).$$

The complexity of this min*− operation is that of min*(2 element) operation.

There is also a very useful property of the min*− operation when compared to the min*+ operation. As mentioned above, the min*− operation is an inverse of the min*+ operation. This operation may be shown below. Since $e^{-x}+e^{-y}>e^{-y}$, we have $-\ln(e^{-x}+e^{-y})<y$, thus, $\min^*+(x,y)<y$. Therefore, by employing the definitions of min*+ and min*−, the following relationship may be made as follows:

$$\min^*-(\min^*+(x,y),y)=-\ln(e^{\ln(e^{-x}+e^{-y})}-e^{-y})=-\ln(e^{-x})=x$$

This relationship and operation may be employed to provide for significantly reduced computationally complexity that performing straightforward min* or max* processing. Using the relationships introduced above, a min* processing functional block that employs both min*− and min*+ operations may be employed. Alternatively, by using analogous relationships corresponding to max* processing, a max* processing functional block that employs both max*− and max*+ operations may be employed.

The relationships between the max*− and max*+ operations of max* are described below in light of the decoding processing to be performed herein.

Some of the similar terms between the definitions of min*(x,y) and max*(x,y), can also be seen when the two terms are compared together as follows:

$$\min^*(x,y)=-\ln(\exp(-x)+\exp(-y))$$

$$\max^*(x,y)=\ln(\exp(x)+\exp(y))$$

Using these similarities, the following relationship may be made between min*(x,y) and max*(x,y):

$$\min^*(x,y)=-\max^*(-x,-y).$$

Using the min*− operator, the following decoding procedure can be carried out to update the edge information.

1. use m min*(x,y) operators to compute: A=min*(|L_c(e_0)|, . . . , |L_c(e_m)|);

2. use 1 (one) min*(x,y) operator to compute: $L_b(e_i)=\min^*-(A,|L_c(e_m)|)$.

Since the complexity of the min*− operator (e.g., min*(x,y)) is almost the same as that of the min* operator (e.g., min*+(x,y) or simply, min*(x,y)), then the total number of operations is equivalent to 2m+1 min*(x,y) operations. Therefore, this approach to decoding LDPC codes is faster or costs less area within a device than using prior art approaches.

In addition to the decoding approach described above and within the corresponding figure, another possible approach to decoding LDPC coded signals is provided below and within the corresponding figures.

Figure 18:
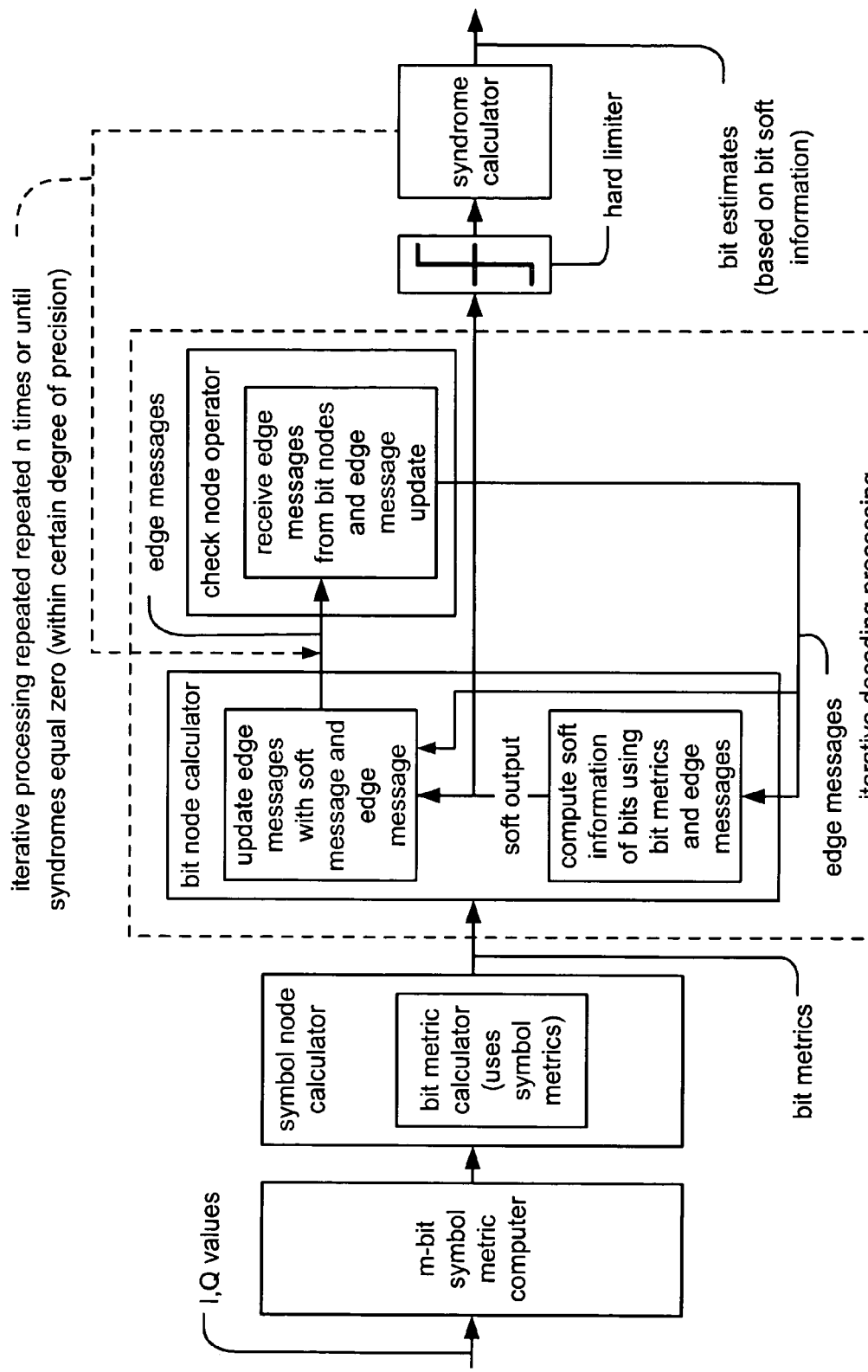
FIG. 18 is a diagram illustrating an embodiment of LDPC (Low Density Parity Check) decoding functionality using bit metric according to the invention.

FIG. 18 is a diagram illustrating an embodiment of LDPC (Low Density Parity Check) decoding functionality using bit metric according to the invention. To perform decoding of an LDPC coded signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 19:
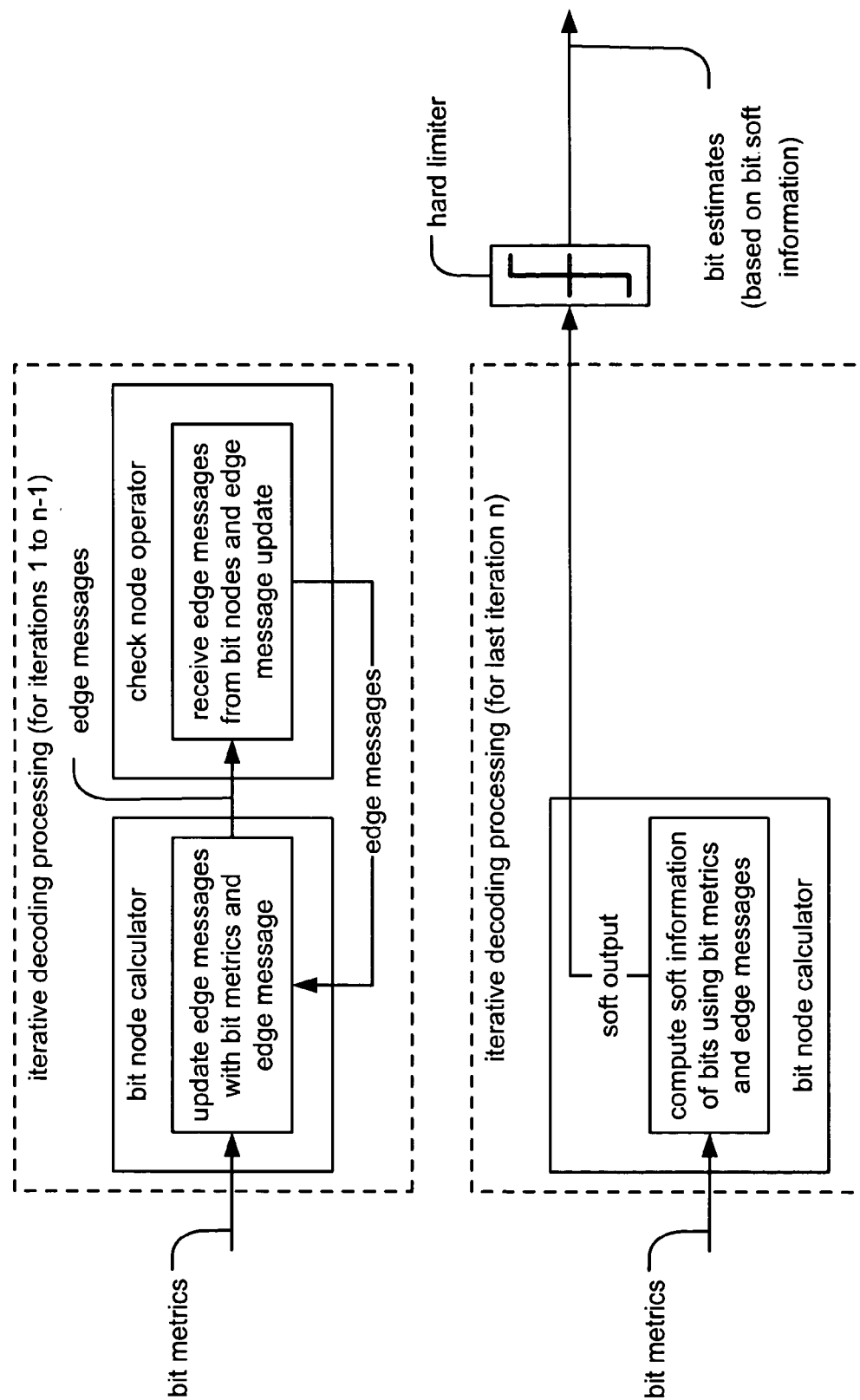
FIG. 19 is a diagram illustrating an alternative embodiment of LDPC decoding functionality using bit metric according to the invention (when performing n number of iterations).

FIG. 19 is a diagram illustrating an alternative embodiment of LDPC decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

When considering the beneficial performance enhancements provided by the strategic use of the min† and the min†− operators, the min operator (including being broken down into min− and min+) and the max operator (including being broken down into max− and max+) are also provided here.

The min** operator is provided below:

min+(x,y)=min(x,y)(as defined above)

$$\min{}^{**}-(x, y) = \ln\left(\frac{\exp(-(x+y)) - 1}{\exp(-y) - \exp(-x)}\right)$$

min($x_1, \ldots, x_{N-1}$)=min−(min**+($x_1, \ldots, x_N$), $x_N$)

The max** operator is provided below:

max+(x,y)=min+(x,y)

In addition, the following relationships are provided between the max*− operator (e.g., max**−(x,y)) and the min*− operator (e.g., min**−(x,y)).

$$\max{}^{}-(x, y) = \min{}^{}-(x, y) = -\max(-x, -y) - \ln\left(\frac{1 - \exp(-(x+y))}{1 - \exp(-|x-y|)}\right)$$

In addition, the following relationships are provided between the max* operator (e.g., max*(x,y)) and the max operator (e.g., max(x,y)).

max*(x,y)=ln(exp(x)+exp(y))=max(x,y)+ln(1+exp(−|x−y|))

When decoding LDPC coded signals, one of the greatest difficulties in implementing many of these various complex equations in hardware is that a significant number of calculations need to be made. This can result in either a very large-scale (relatively speaking) device needed to accommodate all of the calculations and/or a relatively long latency to provide the time to perform all of these complex calculations. A compromise is oftentimes made when implementing such decoders, in that, some approximations are made to ease the hardware implementation and also to provide for relatively faster operation. However, there can be many problems when making such approximations.

One approach that can be made is to employ the min* operator to generate an approximation for the min** operator. However, this does not provide a very good approximation. Even when the min* operator is broken down into the min*+ and the min*− operators, this simply does not provide very good precision when approximating the min** operator. Therefore, within whichever decoding approach is employed in a given decoder embodiment, there can be some problems associated with the min*− operator. The min* operator is not a good approximation of the min** operator, and the min*− operator is also not a very good approximation of the min** operator.

Another problem can arise from the fact when operating in a radix system with finite precision. For example, the following relationship with respect to the min* operator holds true in mathematical theory, but it can fall apart within a radix system with finite precision.

min*(|$L_c(e_0)$|, . . . , |$L_c(e_m)$|)≠|$L_c(e_i)$|
for any i∈{0, . . . , m}.

That is to say, some values of the absolute value of the updated edge information, shown here with respect to the check edges (e.g., $L_c(e_i)$), may in fact be equal to the min* operator result of the absolute value of that updated edge information of with all of the other updated edge information results. That is to say, for some i∈{0, . . . , m}, the following relationship may in fact undesirably exist in a radix system with finite precision:

min*(|$L_c(e_0)$|, . . . , |$L_c(e_m)$|)=|$L_c(e_i)$|.

When this occurs in such a radix system with finite precision, it deems the min*− operator to be meaningless.

The min* operator and the min*− operator are again provided here for such a comparison to see how the min*− operator may lose its significant in such a situation. Since the min*− operator, the min† operator, and the min†− operator all use the min* operator either directly or interveningly, the min* operator is yet again provided mathematically and shown graphically in the corresponding figure.

Figure 20A:
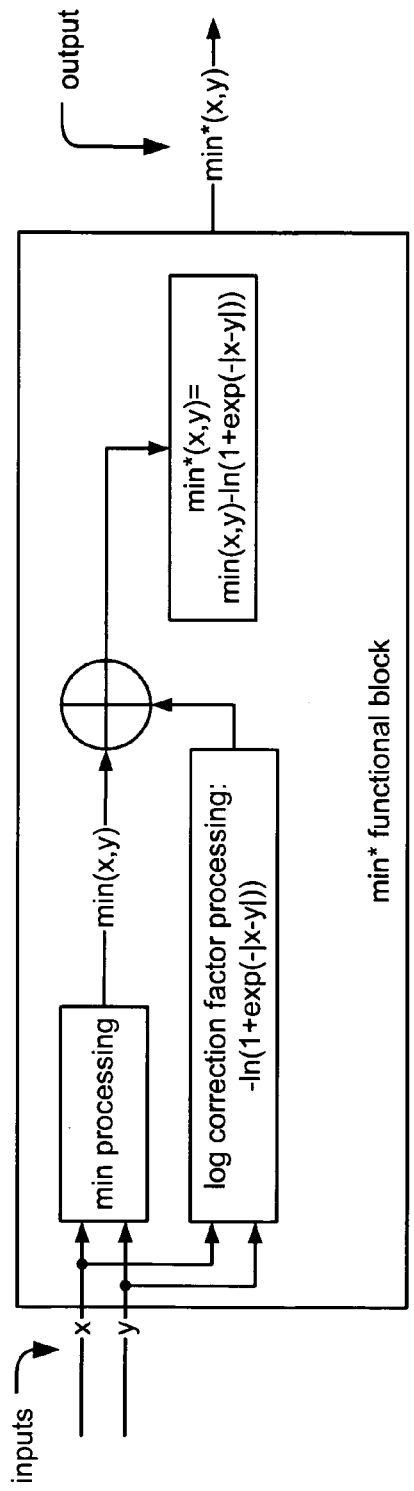
FIG. 20A is a diagram illustrating an embodiment of processing of a min* (min-star) functional block in accordance with the invention.

FIG. 20A is a diagram illustrating an embodiment of processing of a min* (min-star) functional block in accordance with the invention.

min*(x,y)=min(x,y)−ln(1+$e^{-|x-y|}$)

In this embodiment, the logarithmic correction factor, −ln(1+$e^{-|x-y|}$), may be calculated in real time for any values provided as input for x and y. Other embodiments may be implemented such that a predetermined number of possible values of the logarithmic correction factor, −ln(1+$e^{-|x-y|}$), may be stored in some type of memory device for very fast retrieval. Given the fact that a decoder is implemented using finite precision (e.g. a particular number of bits in a digital hardware implementation), a predetermined number of possible values of the logarithmic correction factor, −ln(1+$e^{-|x-y|}$), may be calculated beforehand and then stored within the memory device for very fast subsequent retrieval.

Figure 20B:
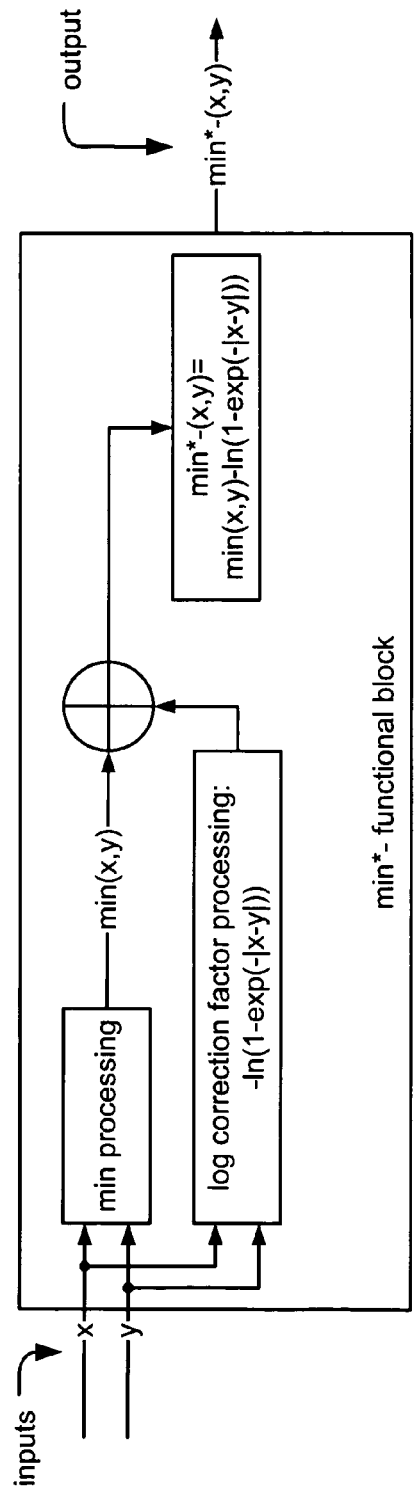
FIG. 20B is a diagram illustrating an embodiment of processing of a min*− (min-star minus) functional block in accordance with the invention.

FIG. 20B is a diagram illustrating an embodiment of processing of a min*− (min-star minus) functional block in accordance with the invention.

$$\min{}^{*-}(x,y)=\min(x,y)-\ln(1-e^{-|x-y|}).$$ EQ 5

This embodiment is very analogous to the embodiment described above within the FIG. 20A. For example, in this embodiment, a different logarithmic correction factor, $-\ln(1-e^{-|x-y|})$, may be calculated in real time for any values provided as input for x and y. Other embodiments may be implemented such that a predetermined number of possible values of this different logarithmic correction factor, $-\ln(1-e^{-|x-y|})$, may also be stored in some type of memory device for very fast retrieval. Given the fact that a decoder is implemented using finite precision (e.g. a particular number of bits in a digital hardware implementation), a predetermined number of possible values of this different logarithmic correction factor, $-\ln(1-e^{-|x-y|})$, may be calculated beforehand and then stored within the memory device for very fast subsequent retrieval.

Figure 21A:
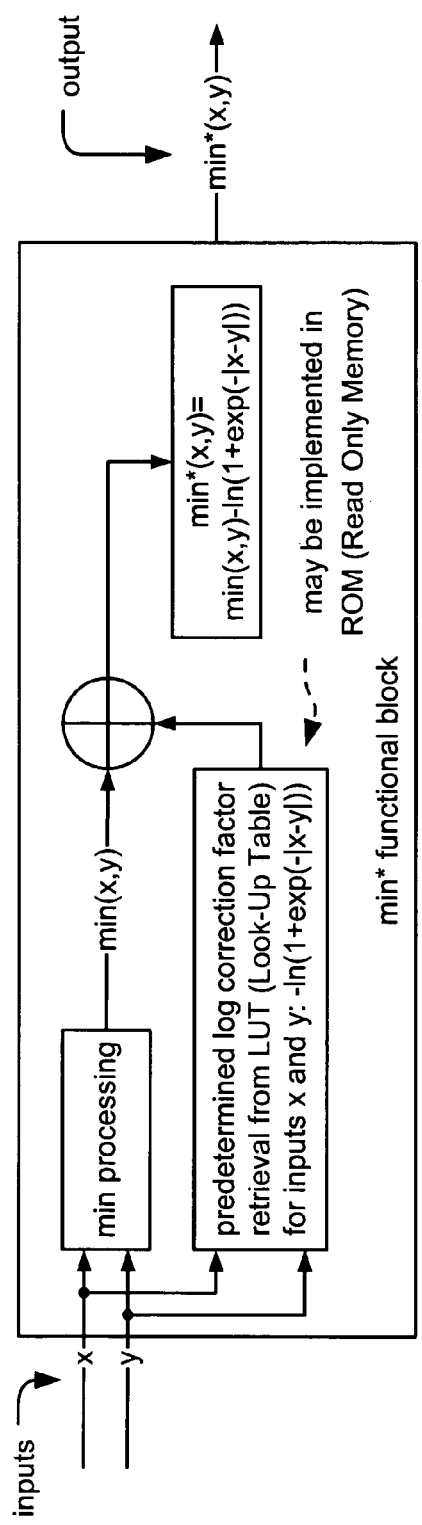
FIG. 21A is a diagram illustrating an alternative embodiment of processing of a min* (min-star) functional block in accordance with the invention.

FIG. 21A is a diagram illustrating an alternative embodiment of processing of a min* (min-star) functional block in accordance with the invention. This embodiment shows a particular embodiment where the predetermined number of possible values of the logarithmic correction factor, $-\ln(1+e^{-|x-y|})$, may be stored in a LUT (Look-Up Table) for very fast retrieval when actually performing decoding processing. In one embodiment, the LUT is stored in a memory device such as a ROM (Read Only Memory). Clearly, other types of memory devices may include the LUT that stores the predetermined number of possible values of the logarithmic correction factor, $-\ln(1+e^{-|x-y|})$, without departing from the scope and spirit of the invention.

Figure 21B:
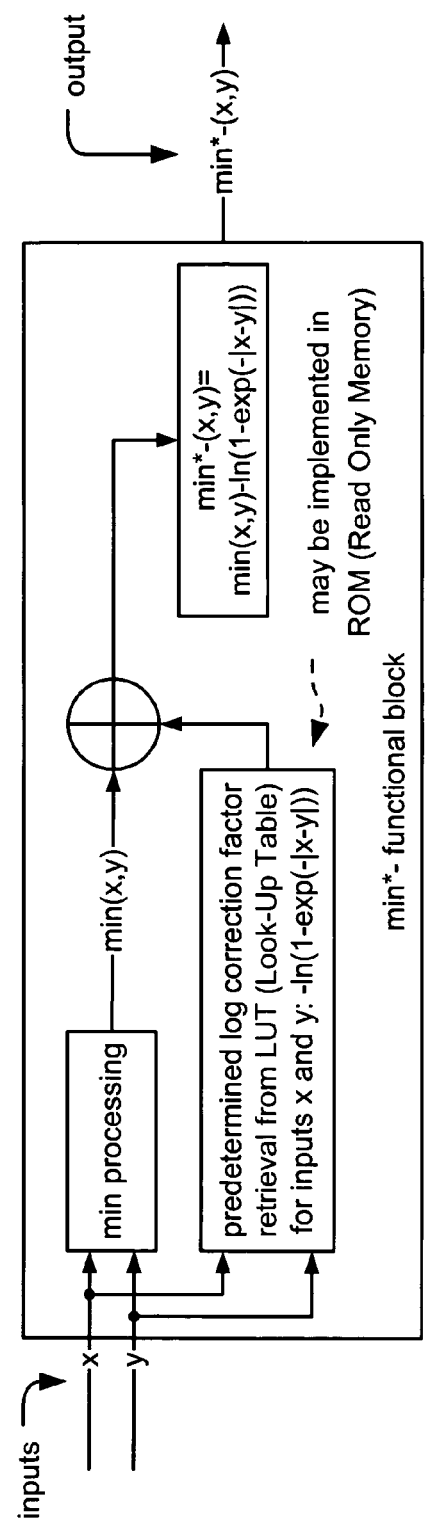
FIG. 21B is a diagram illustrating an alternative embodiment of processing of a min*− (min-star minus) functional block in accordance with the invention.

FIG. 21B is a diagram illustrating an alternative embodiment of processing of a min*− (min-star minus) functional block in accordance with the invention. This embodiment is very analogous to the embodiment described above within the FIG. 21A. This embodiment shows a particular embodiment where the predetermined number of possible values of the different logarithmic correction factor, $-\ln(1-e^{-|x-y|})$, may be stored in a LUT for very fast retrieval when actually performing decoding processing. Again, in one embodiment, the LUT is stored in a memory device such as a ROM. Clearly, other types of memory devices may include the LUT that stores the predetermined number of possible values of the different logarithmic correction factor, $-\ln(1-e^{-|x-y|})$, without departing from the scope and spirit of the invention.

It is also noted that other various possible calculated values may also be stored in similar LUTs to allow for very fast retrieval thereof during the actual performance of the decoding processing thanks to the finite precision nature of an actual embodiment's implementation.

Given that an actual decoder is implemented with a finite degree of precision (e.g., not with an infinite degree of precision), this can result in the meaningless case to occur with a relatively high degree of frequency. In fact, when decoding LDPC coded signals, this meaningless case occurs quite a lot within a system having finite precision (e.g., a radix system with finite precision), and this contributes to a significant loss in performance.

A further description is provided below showing how this meaningless case may occur within a radix 2 system of finite precision. Initially, a radix 10 system is described to transition the reader to the radix 2 system.

Usually, a real number, x, is represented in the radix 10 system as follows:

$$x = \text{sign}(x)\left[\sum_{j=0}^{m} n_j 10^j + \sum_{j=1}^{\infty} \frac{n_{-j}}{10^j}\right]$$ EQ 13 where sign(x)=1 if x≥0,−1, otherwise $n_j$ is a non-negative integer. However, in any physically realizable digital system, the radix 2 system is used (and not the radix 10 system). In the radix 2 system, a real number, x, is represented as follows:

$$x = \text{sign}(x)\left[\sum_{j=0}^{m} b_j 2^j + \sum_{j=1}^{\infty} \frac{b_{-j}}{2^j}\right]$$ EQ 14 where $b_j$ is a binary number (e.g., either 0 or 1). An example is provided to show how a real number, −27.8125, may be represented according to this convention in the radix 2 system.

$$-27.8125 = -\left(2^4 + 2^3 + 2^1 + 2^0 + \frac{1}{2^1} + \frac{1}{2^2} + \frac{1}{2^4}\right)$$ EQ 15

Moreover, in today's binary hardware implementations, this technology allows only a finite number of bits to be employed within any given calculation. In fact, as an example, to represent the real number, −27.8125, as shown above, in binary vector form, a decision must be made with respect to the total number of bits are to be used in a particular hardware implementation.

As one example, a 10 bit system may be employed that uses the MSB (Most Significant Bit) as the sign bit (0 being positive, and 1 being negative), the next 5 bits representing the integer part, and the last 4 bits representing the fraction (or decimal) part of the number. Using this 10 bit system, the real number, −27.8125, may be represented in binary form as 1110111101.

In general, consider I and F to be non-negative numbers. A radix 2 system of (I,F) precision may be defined as follows:
1. every bit has I+F+1 bits.
2. the MSB is a sign bit.
3. the next I bits represent the integer part of the number.
4. the next F bits represent the fractional (or decimal) part of the number.

Therefore, if the binary number, $b_I b_{I-1} \ldots b_0 b_{-1} \ldots b_{-F}$, is in the radix 2 system of (I,F) precision, the representation of this number in the radix 10 system is as follows:

$$(-1)^{b_I}\left(\sum_{i=0}^{I-1} b_i 2^i + \sum_{j=1}^{F} \frac{b_{-j}}{2^j}\right)$$ EQ 16

For example, if the binary number, 1110111101, in the radix 2 system of (5,4) precision in the radix 10 system would be −27.8125.

However, in many applications, the precision achieved during any types of calculations is limited by the actual hardware implementation. Therefore, numbers with large precision have to be rounded to a given precision so that it can actual be implemented in a device. For example, in the radix 2 system of (5,2) precision, the real number, −27.8125, has to be rounded up the real number, −27.75, with binary representation of 11101111.

In general, to round up a number, x, to the radix 2 system of (I,F) precision, the following operations need to be carried out:

1.

$$\text{compute } \tilde{x} = \left\lfloor x \times 2^F + \frac{1}{2} \right\rfloor,$$

where $\lfloor a \rfloor$ is a floor function which takes the biggest integer that is less than or equal to a;

2. if $\tilde{x} \geq 2^{I+F}$, then the round up number is $2^{I+F}-1$;
3. if $\tilde{x} \leq 2^{I+F}$, then the round up number is $-2^{I+F}$;
4. if $-2^{I+F} < \tilde{x} < 2^{I+F}$, then the round up number is $\tilde{x}$;

In this description and disclosure, the round up number of x in the radix 2 system of (I,F) precision is denoted by $x_{(I,F)}$. Therefore, the following relationship may be made:

$$-27.8125_{(5,2)} = 11101111 = -27.75_{(5,2)} \qquad \text{EQ 17}$$

This example shows how the two numbers −27.8125 and −27.75 are in fact equal in the radix 2 system of (5,2) precision. This example very simply shows how, within finite precision systems (having a finite number of bits in a physical implementation), how various numbers can in fact be treated equally and subsequently result in later loss of precision.

The new min†− (min-dagger minus) operator is presented in greater detail below with a meaningful approach to using it when decoding LDPC coded signals. The min\ operator is a relatively good approximation of the min operator. The min operator that operates on 2 input values, x and y, is again provided below:

If $x,y \geq 0$, then $$\min{}^{**}(x, y) = f(x, y) = \ln\left(\frac{1 + \exp(x+y)}{\exp(x) + \exp(y)}\right) \geq 0. \qquad \text{EQ 18}$$

This may be referred to as min processing of the inputs of x and y (alternatively: min-double-star processing)). The min operator may also be referred to as the min-double-star operator. The min\ operator is also provided here.

Figure 22A:
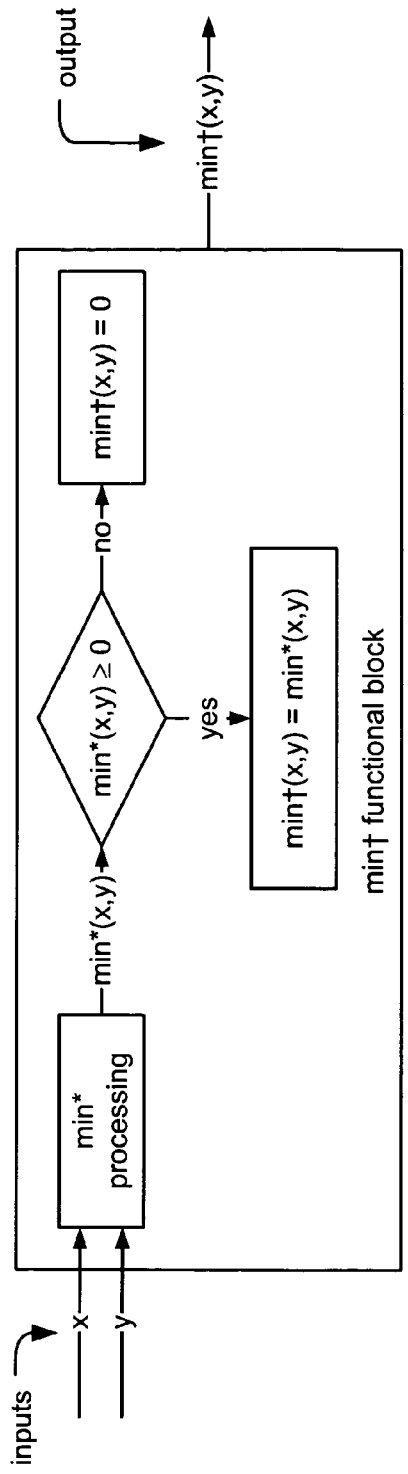
FIG. 22A is a diagram illustrating an embodiment of processing of a min† (min-dagger) functional block in accordance with the invention.

FIG. 22A is a diagram illustrating an embodiment of processing of a min† (min-dagger) functional block in accordance with the invention.

This new operator, depicted as the min† operator, or min-dagger operator (whose operation/processing may be also referred to as min† processing (or min-dagger processing)), is performed as follows:

$$\min\nolimits^\dagger(x, y) = \begin{cases} \min{}^*(x, y) & \min{}^*(x, y) \geq 0 \\ 0 & \text{otherwise} \end{cases} \qquad \text{EQ 19}$$

and $$\min\nolimits^\dagger(x_0, x_1, \ldots, x_k) = \min\nolimits^\dagger(\min\nolimits^\dagger(x_0, x_1, \ldots, x_{k-1}), x_k). \qquad \text{EQ 20}$$

Figure 22B:
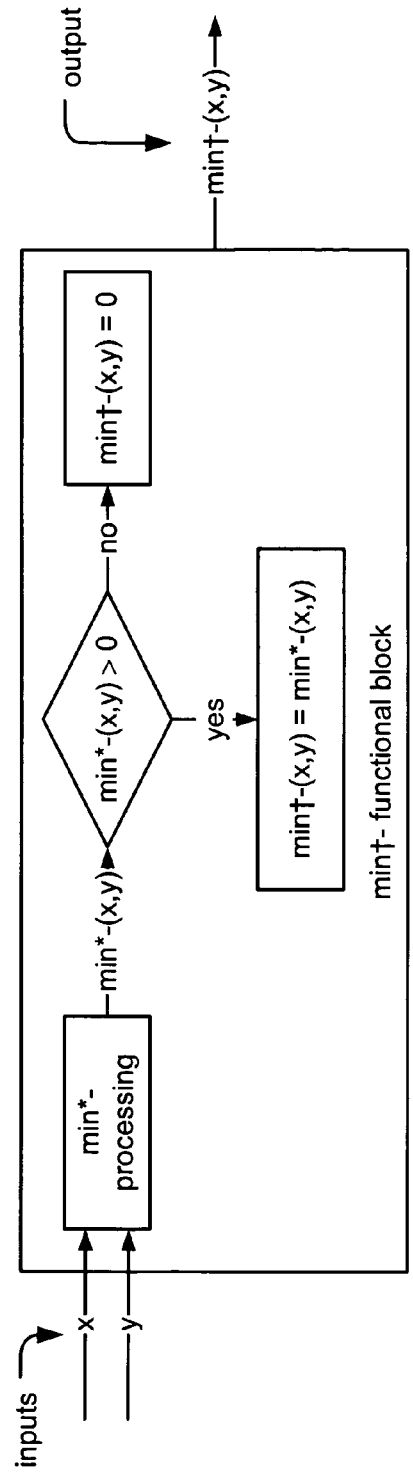
FIG. 22B is a diagram illustrating an embodiment of processing of a min†− (min-dagger minus), functional block in accordance with the invention.

FIG. 22B is a diagram illustrating an embodiment of processing of a min†− (min-dagger minus) functional block in accordance with the invention.

A new operator, depicted as the min†− operator, or min-dagger minus operator (whose operation/processing may be also referred to as min†− processing (or min− dagger minus processing)), is introduced as follows:

$$\min\nolimits^\dagger{-}(x, y) = \begin{cases} \min{}^*-(x, y) & \min{}^*-(x, y) > 0 \\ 0 & \text{otherwise} \end{cases} \qquad \text{EQ 21}$$

This newly introduced min†− operator has the following property.

Min†− Properties

This newly introduced min†− operator may be used in a very meaningful approach with respect to decoding of LDPC coded signals. Before looking at the application of the min†− operator within the context of assisting in the various calculations to be performed within decoding of LDPC coded signals, several properties of the min†− operator, and the intervening calculations performed therein, are provided below with respect to various propositions and corollaries.

Proposition 1

Let $x_0, \ldots, x_k$ be non-negative numbers and $A = \min{}^*\{x_0, \ldots, x_k\}$. Then the following relationship holds true.

$$\min\nolimits^\dagger{-}(A, x_i) = \min\nolimits^\dagger\{x_0, \ldots, x_{i-1}, x_{i+1}, \ldots, x_k\} \qquad \text{EQ 22}$$

for any $i \in \{0, \ldots, k\}$.

The proof of this property may be easily seen based on the following relationship.

$$\min{}^*-(A, x_i) = \min{}^*\{x_0, \ldots, x_{i-1}, x_{i+1}, \ldots, x_k\} \qquad \text{EQ 23}$$

Proposition 2

Suppose $y_1, \ldots, y_m$ are non-negative numbers. Let $i,j \in \{1, \ldots, m\}$, then the following property holds true.

$$\min{}^*\{y_1, \ldots, y_m\} = \min{}^*\{\min{}^*(y_i, y_j), y_k | k \in \{1, \ldots, m\} \setminus \{i,j\}\} \qquad \text{EQ 24}$$

The proof of the relationship provided above is shown below.

$$\begin{aligned}\min{}^*\{\min{}^*(y_i, y_j), y_k\} | \\ k \in \{1, \ldots, m\} \setminus \{i, j\} &= -\ln\bigl(\exp[\exp(-y_i) + \\ &\quad \exp(-y_j) + \sum_{k \neq i,j} \exp(-y_k)]\bigr) \\ &= -\ln\left(\sum_{k=1}^{m} \exp(-y_k)\right) \\ &= \min{}^*\{y_1, \ldots, y_m\}\end{aligned} \qquad \text{EQ 25}$$

Proposition 3

Suppose $y_1, \ldots, y_m$ are non-negative numbers. Then the following relationship holds true.

$$\min{}^*\{y_1, \ldots, y_m\} < \min\{y_1, \ldots, y_m\} \qquad \text{EQ 26}$$

Moreover, if all of the values, $y_i$, are integers in the radix 2 system of (I,F) precision, then the following relationship holds true.

$$\min{}^*(\{y_1, \ldots, y_m\}_{(I,F)}) < \min\{y_1, \ldots, y_m\} \qquad \text{EQ 27}$$

The proof of the relationship provided above is shown below.

For any two integers, i, j∈{1, . . . , m}, the following relationship holds true.

$$\min^*\{y_i, y_j\} = \min\{y_i, y_j\} - \ln(1+\exp(-|y_i - y_j|)) < \min\{y_i, y_j\} \quad \text{EQ 28}$$

since the value, $y_i, y_j \geq 0$ and the value, $\ln(1+\exp(-|y_i-y_j|))<0$. With the conclusion and also considering the Proposition 2 presented above, the following conclusion may be made.

$$\min^*\{y_1, \ldots, y_m\} = \min^*\{\min^*\{y_1, \ldots, y_{m-1}\}, y_m\} \quad \text{EQ 29}$$

$$< \min\{\min^*\{y_1, \ldots, y_{m-1}\}, y_m\}$$

$$= \min\{\min^*\{\min^*(\{y_1, \ldots, y_{m-2}\}, y_{m-1})\}, y_m\}$$

$$< \min\{\min^*\{y_1, \ldots, y_{m-2}\}, y_{m-1}, y_m\}$$

$$< \ldots$$

$$< \min\{y_1, \ldots, y_m\}$$

This relationship proves the first part of the Proposition.

The value, A, may be denoted as follows: $A = \min^*\{y_1, \ldots, y_m\}_{(I,F)}$. Then EQ 27 holds true if $A<0$. However, the case is considered now if $A \geq 0$. It is assumed that there is an integer, i, such that $i \in \{1, \ldots, m\}$ and such that $y_i < A$. Based on this, the following relationship holds true.

$$A - y_i \geq 2^{-F} \quad \text{EQ 30}$$

since both A and $y_i$ are in the radix 2 system of (I,F) precision. On the other hand, by the very definition of (I,F) precision, the following relationship holds true.

$$\min^*\{y_1, \ldots, y_m\} \geq A - 2^{-(F+1)} \quad \text{EQ 31}$$

By combining the EQ 30 and the EQ 31, the following relationship may be made.

$$\min^*\{y_1, \ldots, y_m\} \geq A - 2^{-(F+1)} \geq y_i + 2^{-F} - 2^{-(F+1)} > y_i \quad \text{EQ 32}$$

which is actually a contradiction. Therefore, $y_i \geq A$, for any integer, i, such that $i \in \{1, \ldots, m\}$. Therefore, this proves the second part of the Proposition.

The following corollary is the direct consequence of the above Proposition.

Corollary 1

Let $x_0, \ldots, x_k$ are non-negative numbers in the radix 2 system of (I,F) precision. If there is $i \in \{1, \ldots, k\}$ such that $x_i = \min^*\{x_0, \ldots, x_k\}_{(I,F)}$, then $x_i = \min\{x_0, \ldots, x_k\}$.

Using all of these various properties provided above with respect to various propositions and corollaries, the new min†− operator may be employed to perform some of the various calculations when decoding LDPC coded signals.

Conclusion

Let $x_0, \ldots, x_k$ are non-negative numbers in the radix 2 system of (I,F) precision with $F>1$. If there exists $i_0 \in \{0, \ldots, k\}$ such that $x_{i_0} = \min^*\{x_0, \ldots, x_k\}_{(I,F)}$, then the number, $x_{i_0}$, is in fact unique and the following relationship is true: $x_{i_0} = \min\{x_0, \ldots, x_k\}$.

The proof of the relationship provided above is shown below.

Denote $A = \min^*\{x_0, \ldots, x_k\}_{(I,F)}$. If $A<0$, then none of the elements of $\{x_0, \ldots, x_k\}$ is equal to A since all of the elements, $x_j$, are greater than or equal to zero (e.g., 0). The assumption is made that there is another value, $i_1 \in \{1, \ldots, k\}$, with $i_1 \neq i_0$, such that $A = x_{i_0} = x_{i_1}$. Denote $B = \min^*\{x_j | i \neq i_0, i_1\}$. Then, $\min^*\{x_0, \ldots, x_k\} = \min^*\{B, A, A\}$ by Proposition 2 above, and $B > \min^*\{x_0, \ldots, x_k\}$ by Proposition 3 above. Thus, $B > A - 2^{-(F+1)} \geq A - \frac{1}{4} > A = \ln(2)$. Therefore, the following relationship holds true.

$$A \leq \min^*\{x_0, \ldots, x_k\} + 2^{-(F+1)} \quad \text{EQ 33}$$

$$= \min^*\{B, \min^*\{A, A\}\} + 2^{-(F+1)}$$

$$= \min^*\{B, A - \ln(2)\} + 2^{-(F+1)}$$

$$< \min\{B, A - \ln(2)\} + 2^{-(F+1)}$$

$$\leq A - \ln(2) + 2^{-2}$$

$$< A - 0.5 + 0.25$$

$$< A$$

which is actually a contradiction. Therefore, the number, $x_{i_0}$, is in fact unique. The minimal property of the number, $x_{i_0}$, is the direct consequence of EQ 27 of the Proposition 3 above.

The following corollary is the direct consequence of the above Conclusion.

Corollary 2

Let $x_0, \ldots, x_k$ are non-negative numbers in the radix 2 system of (I,F) precision with $F>1$. Suppose $x_m = \min\{x_0, \ldots, x_k\}$. Then, for any $i \in \{0, \ldots, k\} \setminus \{m\}$, the relationship $\min^* - \lfloor \min^*\{x_0, \ldots, x_k\}_{(I,F)}, x_i \rfloor$ is always meaningful.

Based on the various relationships presented above, a novel approach to decoding of LDPC coded signals is presented and described below.

Figure 23:
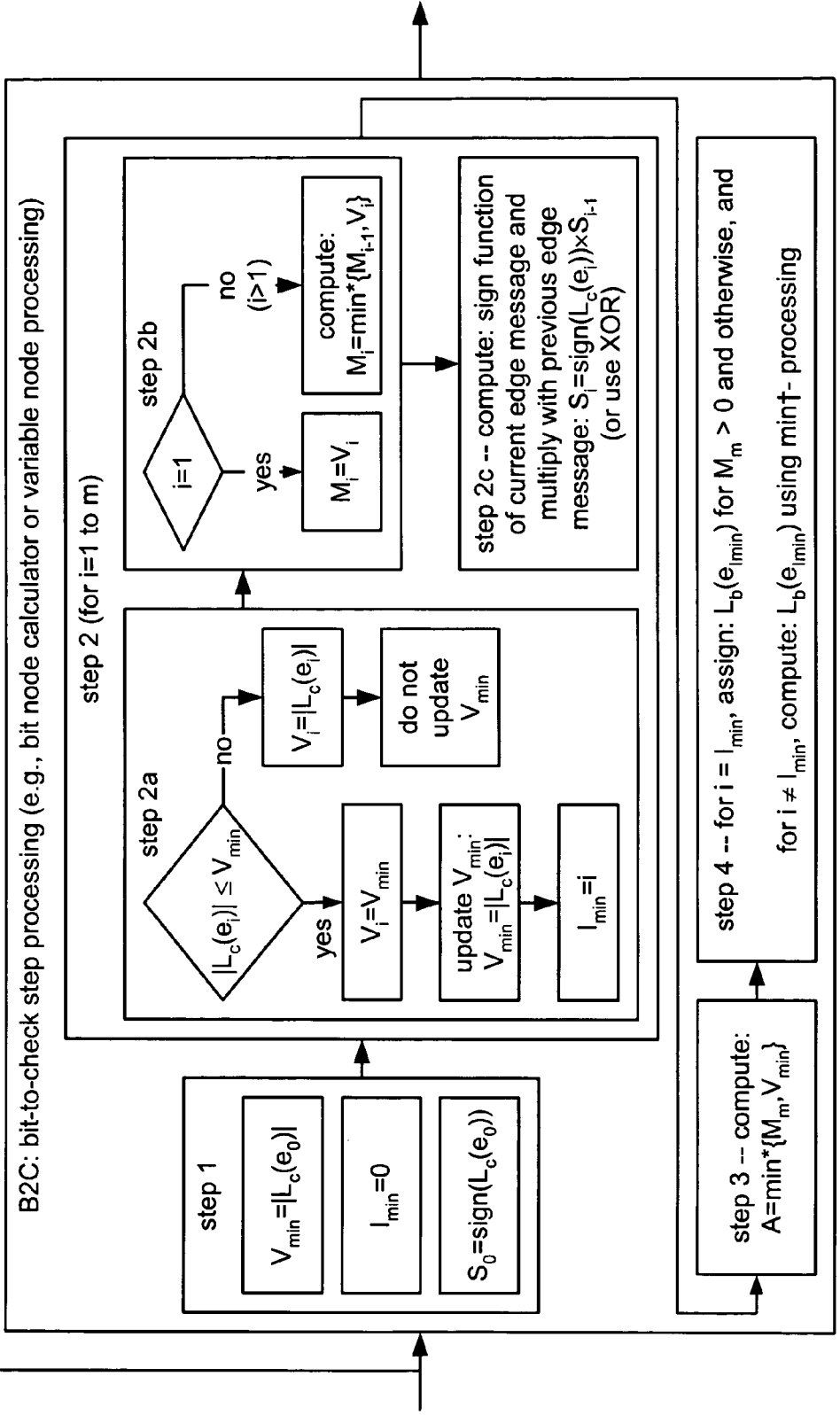
FIG. 23 is a diagram illustrating an embodiment of all meaningful LDPC code decoding using min†− (min-dagger minus) processing (B2C: bit-to-check step processing) in accordance with the invention.

FIG. 23 is a diagram illustrating an embodiment of all meaningful LDPC code decoding using min†− processing (B2C: bit-to-check step processing) according to the invention.

The processing described here is in the context of the B2C decoding step. This may be viewed as being the decoding step that involves the bit-to-check decoding step, the functionality performed a bit calculator, or the variable node processing functionality as appropriately described above in the various embodiments.

Step 1

During this B2C decoding step, the edge messages, $L_c(e_i)$ $i=0, \ldots, m$ (e.g., edge messages that have been updated, or initialized during first decoding iteration, with respect to the check nodes), are received from the initialization or the C2B decoding step (e.g., the check-to-bit decoding step, the check node processing functionality, or the functionality performed by a check node operator). Initially, the minimal absolute value of the edge messages, $V_{min}$, is defined to be the edge message corresponding to the edge, $e_0$. This may be described mathematically as follows: $V_{min} = |L_c(e_0)|$. Also, the minimal index (e.g., the index of the edge message having the minimal absolute value) is defined to be 0. This may be described mathematically as follows: $I_{min} = 0$. Lastly within the step 1 of decoding processing, the sign function of the initial edge message is defined to be the sign of the edge message corresponding to the edge, $e_0$. This may be described mathematically as follows: $S_0 = \text{sign}(L_c(e_0))$.

Step 2

Continuing on during this B2C decoding step, the decoding processing operates by addressing all of the other edge messages besides the first one where m=0 (e.g., addresses all the other edge messages from i=1, . . . m).

Step 2a

When performing this decoding processing for all of these other edge messages, if the absolute value of a particular edge messages, $L_c(e_i)$, is less than or equal to the minimal absolute value of the edge messages, $V_{min}$, then the minimal absolute value of that particular edge message, $V_i$, is now defined as being the new minimal absolute value of the edge messages, $V_{min}$. This may be described mathematically as follows: if $|L_c(e_i)| \leq V_{min}$, then let $V_{min} = V_i = |L_c(e_i)|$. Also, the minimal index is updated. This may be described mathematically as follows: if $I_{min} = i$.

However, if the absolute value of the particular edge messages, $L_c(e_i)$, is not less than or equal to the minimal absolute value of the edge messages, $V_{min}$, then the minimal absolute value of the edge messages, $V_{min}$, is not updated at all, and the decoding processing continues on with the next i until i=m.

Step 2b

If there are only 2 values to be considered (e.g., when i=1 and since the case for i=0 is already known), then the result of the min* processing of the absolute value of all of the edge messages except for the minimal one, shown as $M_i$, is simply set to the minimal absolute value of that particular edge message, $V_i$ or $V_1$. This may be described mathematically as follows: $M_i = V_i$ or $M_1 = V_1$.

However, if the decoding iteration is greater than the first iteration beyond initialization (e.g. i>1), then min* processing is performed to generate the results of the min* processing of the absolute value of all of the edge messages except for the minimal one, $M_i$ (e.g. for all of the edge messages except for $V_{min}$). This may be described mathematically as follows: if i>1, then calculate $M_i = \text{min}*\{M_{i-1}, V_i\}$.

Step 2c

The decoding processing continues on by calculating the sign function of current edge message and multiplying it with the previous edge message. This calculation of the sign function of the current edge message and multiplying it with the sign function of the previous edge message may be described mathematically as follows: $S_i = \text{sign}(L_c(e_i)) \times S_{i-1}$.

It is also noted this calculation of the sign function may be implemented in hardware using XOR logic functional blocks. For example, if the $\text{sign}(L_c(e_i)) = +1$ (e.g., a positive sign output), then a value of 1 is assigned to the sign function. If the $\text{sign}(L_c(e_i)) = -1$ (e.g., a negative sign output), then a value of 0 is assigned to the sign function. Alternatively, the opposite convention may be used (e.g. $\text{sign}(L_c(e_i)) = +1$ assigned to 0, and $\text{sign}(L_c(e_i)) = -1$ assigned to 1). The calculation of the sign function of the current edge message may then be performed using logic functional blocks by the XOR operation with the sign function of the previous edge message, and when the final value of the sign function of the current edge message is determined in using these logic functional blocks, then that output value must be re-assigned back to being either +1 or −1 (depending on which assignment function was used earlier when transforming to the logic domain thereby allowing XOR logic functional block implementation). In doing this, multiplication may be avoided and replaced with the XOR operation thereby providing a savings in calculation complexity and also a savings in the associated hardware to perform such calculations.

Step 3

Continuing on during this B2C decoding step, the decoding processing now calculates the min* result of the absolute value of all of the edge messages, A, that is calculated using the minimal absolute value of the edge messages, $V_{min}$, and all of the earlier generated results of the min* processing of the absolute value of all of the edge messages except for the minimal one, shown as $M_m$ below. This may be described mathematically as follows: $A = \text{min}*\{M_m, V_{min}\}$.

Step 4

Continuing on during this B2C decoding step, the assignment and calculation of the edge messages with respect to the bit nodes, $L_b(e_i)$, is performed.

For the edge message indexed by the minimal index, $L_b(e_{I_{min}})$, this particular edge message is simply assigned to be the product of the sign function of all of the edge messages, $S_m$, times the sign function of that particular edge message indexed by the minimal index, $\text{sign}(L_c(e_{I_{min}}))$, times the min* result of the min* processing of the absolute value of all of the edge messages except for the minimal one, $M_m$, when this min* result is in fact greater than zero. Otherwise, when this min* result is not greater than zero, the edge message indexed by the minimal index, $L_b(e_{I_{min}})$, is alternatively assigned to be a value of zero. This may be described mathematically as follows:

$$L_b(e_{I_{min}}) = \begin{cases} S_m \times \text{sign}(L_c(e_{I_{min}})) \times M_m & M_m > 0 \\ 0 & \text{otherwise} \end{cases}.$$

For all of the other edge messages (e.g. those edge messages that are not indexed by the minimal index, where $i \neq I_{min}$), those edge messages, $L_b(e_i)$, are actually computed using min†− processing during the iterative decoding processing of LDPC coded signal decoding.

These edge messages are computed to be the product of the sign function of that particular edge message, $\text{sign}(L_c(e_i))$, times the sign function of all of the edge messages, $S_m$, times the result of the min†− processing of the min* result of the absolute value of all of the edge messages, A, and the absolute value of that particular edge message, $|L_c(e_i)|$. This may be described mathematically as follows:

for $i \neq I_{min}$, $L_b(e_i) = \text{sign}(L_c(e_i)) \times S_m \times \text{min}\dagger-(A, |L_c(e_i)|)$.

It is noted that this decoding processing may be performed in a serial operation within a particular hardware implementation. If desired, the operations described within the step 4 above may alternatively be performed in a parallel operation within a particular hardware implementation.

In this disclosure, the various performance diagrams are described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR) thereby providing a relatively concise representation of the performance of the decoding approach.

Figure 24:
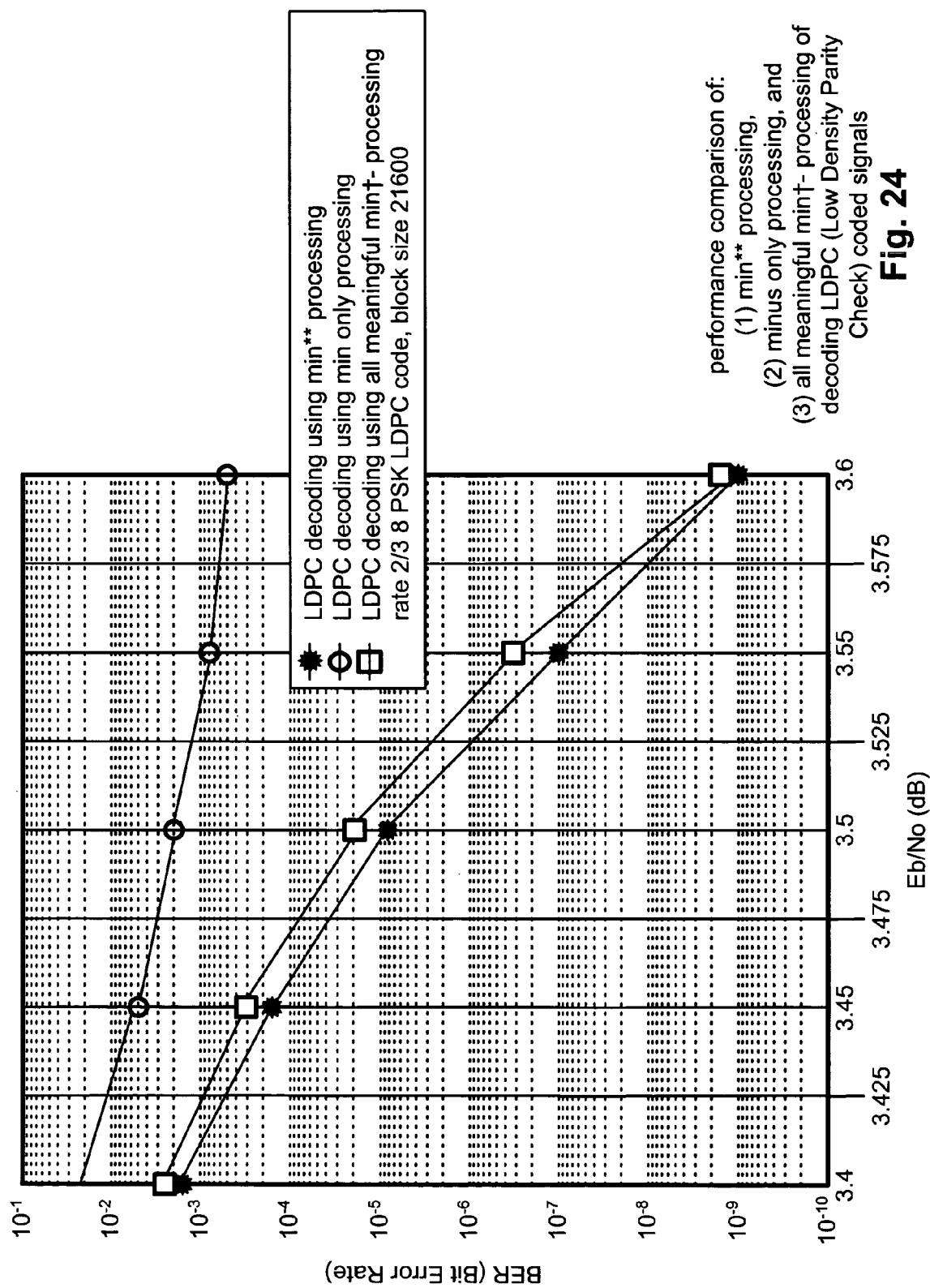
FIG. 24 is a diagram illustrating an embodiment of performance comparison of: (1) min** processing, (2) minus only processing, and (3) all meaningful min†− processing of decoding LDPC (Low Density Parity Check) coded signals according to the invention.

FIG. 24 is a diagram illustrating an embodiment of performance comparison of: (1) min** processing, (2) minus only processing, and (3) all meaningful min†− processing of decoding LDPC (Low Density Parity Check) coded signals according to the invention. This comparative analysis, of these 3 different decoding approaches, is performed using a code rate ⅔ 8 PSK (Phase Shift Key) LDPC code with a block size of 21600. It is noted that the min processing approach is also included here has a relatively large number of meaningless cases. Within this performance diagram, the disastrous effects can be seen when meaningless cases occur within the various calculations performed within the iterative decoding processing of LDPC coded signals.

As can be seen within this comparative performance diagram, for a variety of values of $E_b/N_o$ (or SNR), the BER that may be achieved when employing all meaningful min†– processing very closely approaches the BER of the min processing approach of decoding LDPC coded signals. Both the all meaningful min†– processing and the min processing approach vastly out perform the min only processing approach.

Figure 25:
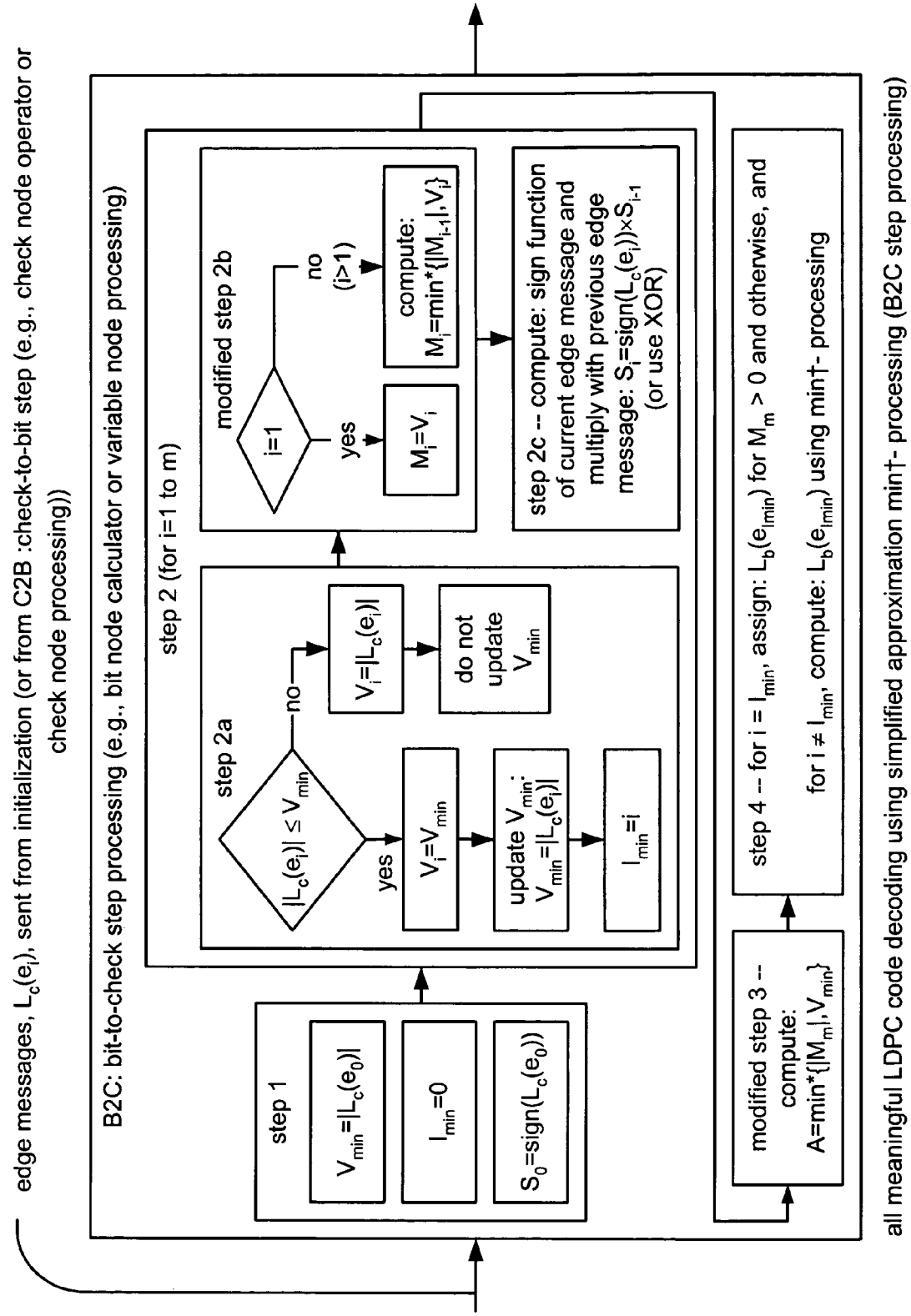
FIG. 25 is a diagram illustrating an embodiment of all meaningful LDPC code decoding using simplified approximation min†− (min-dagger minus) processing (B2C step processing) in accordance with the invention.

FIG. 25 is a diagram illustrating an embodiment of all meaningful LDPC code decoding using simplified approximation min†– processing (B2C step processing) according to the invention.

This embodiment is a modification of the embodiment describe above with respect to the FIG. 23. This embodiment employs a simplified approximation of the all meaningful min†– processing approach described above while providing only slightly lower performance. Within this approach, the min* processing described above within the Step 2b and the Step 3 are slightly modified. If implemented well, this simplification can result in some hardware savings in a communication device employing this functionality. All of the other processing steps are the same as the embodiment described above with respect to the FIG. 23 except for the Step 2b and the Step 3. As such, only the Modified Step 2b and the Modified Step 3 are described below.

Modified Step 2b

If there are only 2 values to be considered (e.g., when i=1 and since the case for i=0 is already known), then the result of the min* processing of the absolute value of all of the edge messages except for the minimal one, shown as $M_i$, is simply set to the minimal absolute value of that particular edge message, $V_i$ or $V_1$. This may be described mathematically as follows: $M_i=V_i$ or $M_1=V_1$.

However, if the decoding iteration is greater than the first iteration beyond initialization (e.g. i>1), then min* processing is performed to generate the results of the min* processing of the absolute value of all of the edge messages except for the minimal one, $M_i$ (e.g. for all of the edge messages except for $V_{min}$). The modification from the previous Step 2b is that the absolute value of the result of the min* processing of the absolute value of all of the edge messages except for the minimal one, shown as $|M_{i-1}|$ in the following equation, is employed instead of the value of simply, $M_i$. This ultimate result of min* processing, using the absolute value of, may then be described mathematically as follows: if i>1, then calculate $M_i=\min^*\{|M_{i-1}|,V_i\}$.

Modified Step 3

Continuing on during this B2C decoding step, the decoding processing now calculates the min* result of the absolute value of all of the edge messages, A, that is calculated using the minimal absolute value of the edge messages, $V_{min}$, and the absolute value of all of the earlier generated results of the min* processing of the absolute value of all of the edge messages except for the minimal one, $|M_m|$. This modified calculation of A may be described mathematically as follows: $A=\min^*\{|M_m|,V_{min}\}$.

Figure 26:
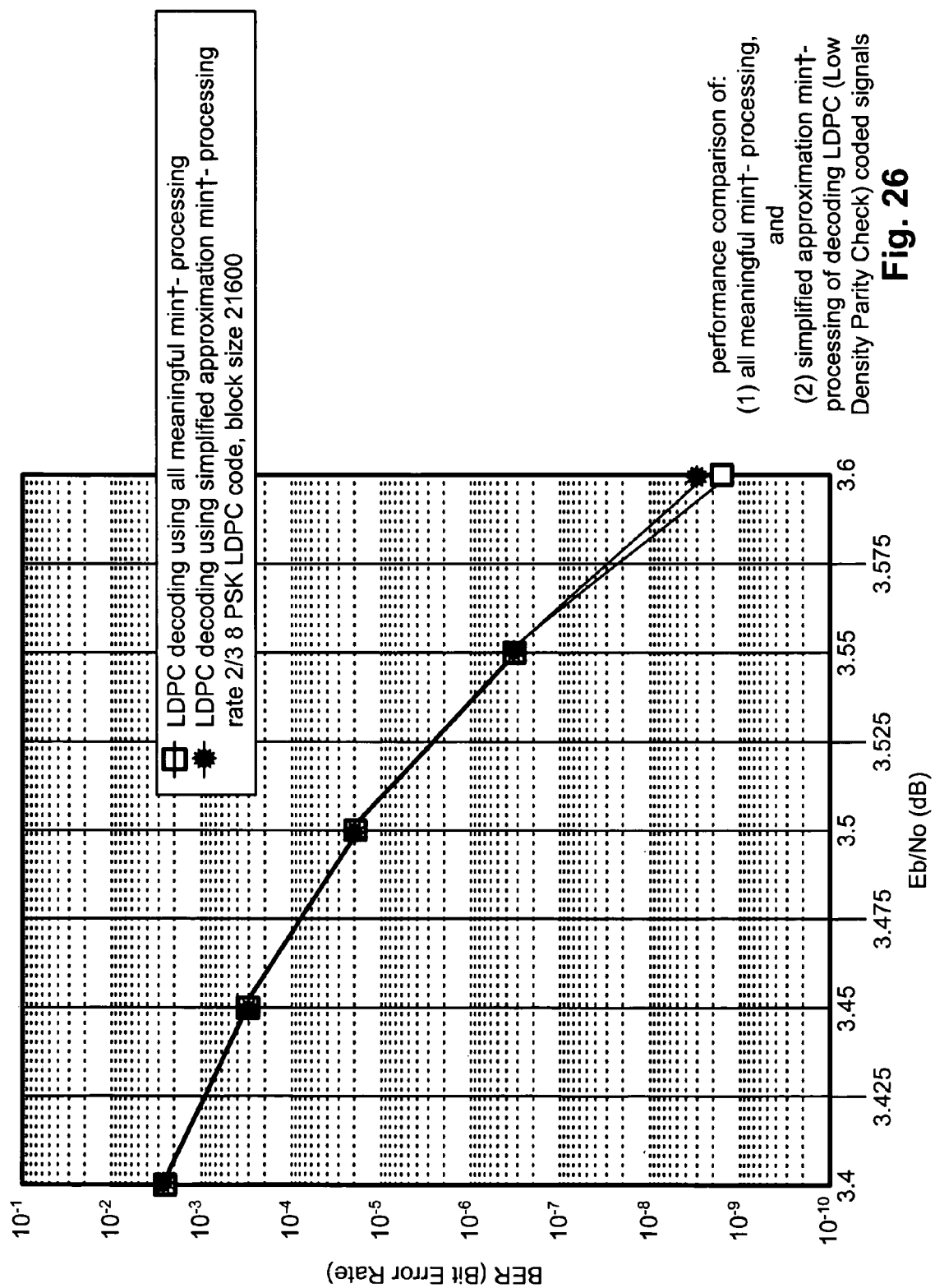
FIG. 26 is a diagram illustrating an embodiment of performance comparison of: (1) all meaningful min†− processing, and (2) simplified approximation min†− processing of decoding LDPC (Low Density Parity Check) coded signals according to the invention.

FIG. 26 is a diagram illustrating an embodiment of performance comparison of: (1) all meaningful min†– processing, and (2) simplified approximation min†– processing of decoding LDPC (Low Density Parity Check) coded signals according to the invention. This comparative analysis, of these 2 different decoding approaches, is again performed using a code rate ⅔ 8 PSK (Phase Shift Key) LDPC code with a block size of 2160. It can readily be seen that the simplified approximation min†– processing of decoding LDPC coded signals is a good approximation of the all meaningful min†– processing of decoding LDPC coded signals.

While the performance of the simplified approximation min†– processing of decoding LDPC coded signals does provide a relatively good performance when compared to the all meaningful min†– processing of decoding LDPC coded signals, it is noted that some of the values obtained using the Modified Step 2b and the Modified Step 3 may not be the same as those values obtained using the Step 2b and the Step 3. An example is provided below to show how these values may in fact be slightly different.

EXAMPLE

Suppose m=10 and the values of the various edge messages with respect to the check nodes are provided as follows:

$$L_c(e_0)=2, L_c(e_1)=8, L_c(e_2)=4, L_c(e_3)=5, L_c(e_4)=3,$$
$$L_c(e_5)=6, \text{ and}$$

$$L_c(e_6)=0.5, L_c(e_7)=7, L_c(e_8)=1.3, L_c(e_9)=0.75,$$
$$L_c(e_{10})=0.6.$$

The results are provided below using each of the all meaningful min†– processing of decoding LDPC coded signals and the simplified approximation min†– processing of decoding LDPC coded signals.

All Meaningful Min†– Processing of Decoding LDPC Coded Signals

Step 3 output A=−0.74865

Then since $\min^*-(A,|L_c(e_g)|)=-0.4481$, the Step 4 outputs $L_b(e_9)=0$.

Simplified Approximation Min†– Processing of Decoding LDPC Coded Signals

For all of the $M_i$, $0 \leq i \leq 9$ are positive, $M_9=0.04207$, $I_{min}=6$, and $V_{10}=10$. However, $M_{10}=\min^*(M_9,M_{10})=-0.41042$. Then, according to the Modified Step 3, the following result is generated: $A=\min^*(0.41042, x_6)=-0.23884$. The Step 4 then continues to compute the following: $\min^*-(A,x_9)=0.2263$. Therefore, $L_b(e_9)=0.2263$ which is clearly different from the value computed using the all meaningful min†– processing of decoding LDPC coded signals approach described above.

Figure 27:
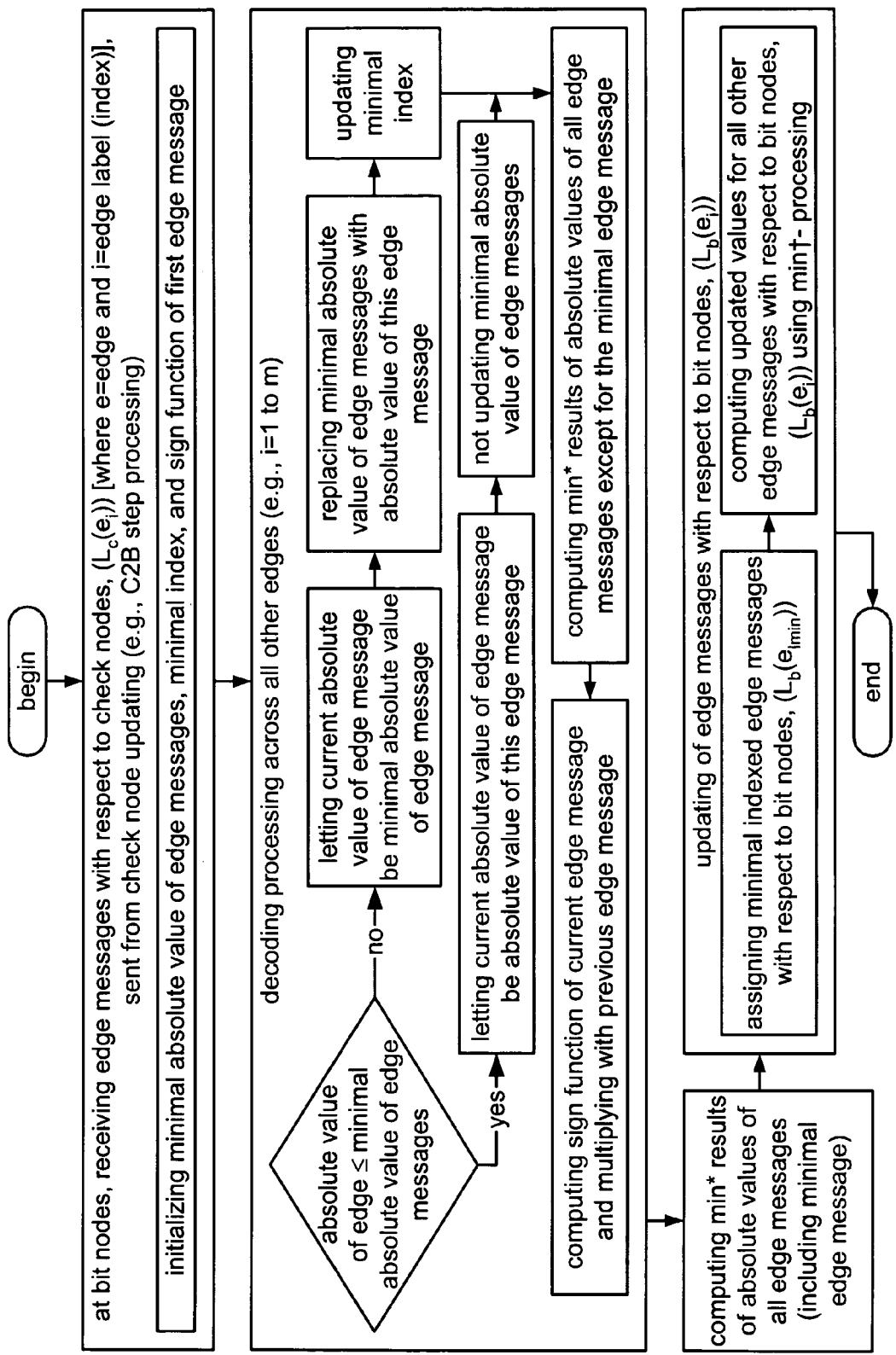
FIG. 27 is a flowchart illustrating an embodiment of a method for performing updating edge messages with respect to bit nodes (B2C: bit-to-check step processing) according to the invention.

FIG. 27 is a flowchart illustrating an embodiment of a method for performing updating edge messages with respect to bit nodes (B2C: bit-to-check step processing) according to the invention. The method described herein may also be performed within an appropriate functional block embodiment as implemented within any of the various communication devices and communication systems described above.

With respect to the bit nodes, the method begins by receiving edge messages with respect to check nodes, ($L_c(e_i)$) [where e=edge and i=edge label (index)], sent from check node updating (e.g., the edge messages from the C2B step processing operations). The method also involves initializing the minimal absolute value of edge messages, $V_{min}$, the minimal index, $I_{min}=0$, and the sign function of first edge message, $S_0=\text{sign}(L_c(e_0))$.

The method then involves decoding processing across all other edges (e.g., i=1 to m). This involves appropriately defining (or letting) the current absolute value of edge message, updating (or not updating, whichever is appropriate) the minimal absolute value of edge messages, and also appropriately updating the minimal index (when appropriate).

The method here involves performing this decoding processing for all of these other edge messages. If the absolute value of a particular edge messages, $L_c(e_i)$, is less than or equal to the minimal absolute value of the edge messages, $V_{min}$, then the method now defines the minimal absolute value of that particular edge message, $V_i$, as being the new minimal absolute value of the edge messages, $V_{min}$. This may be described mathematically as follows: if $|L_c(e_i)| \leq V_{min}$, then let $V_{min} = V_i = |L_c(e_i)|$. Also, the method involves updating the minimal index. This may be described mathematically as follows: if $I_{min} = i$.

However, if the absolute value of the particular edge messages, $L_c(e_i)$, is not less than or equal to the minimal absolute value of the edge messages, $V_{min}$, then method does not update the minimal absolute value of the edge messages, $V_{min}$, at all, and the decoding processing continues on with the next i until i=m.

When there are only 2 values to be considered (e.g., when i=1 and since the case for i=0 is already known), then method sets the result of the min* processing of the absolute value of all of the edge messages except for the minimal one, shown as $M_i$, to the minimal absolute value of that particular edge message, $V_i$ or $V_1$. This may be described mathematically as follows: $M_i = V_i$ or $M_1 = V_1$.

However, if the decoding iteration is greater than the first iteration beyond initialization (e.g. i>1), then the method employs min* processing to generate the results of the min* processing of the absolute value of all of the edge messages except for the minimal one, $M_i$ (e.g. for all of the edge messages except for $V_{min}$). This may be described mathematically as follows: if i>1, then calculate $M_i = \min^*\{M_{i-1}, V\}$. The method then continues on by computing a sign function of a current edge message using a sign function of a previous edge message, as defined according the decoding processing. This calculation of all of the sign function of the current edge message, $S_i$, using the sign function of the previous edge message, $S_{i-1}$, may be described mathematically as follows: $S_i = \text{sign}(L_c(e_i)) \times S_{i-1}$.

The method then involves computing min* results of absolute values of all edge messages (including minimal edge message). The decoding processing calculates the min* result of the absolute value of all of the edge messages, A, that is calculated using the minimal absolute value of the edge messages, $V_{min}$, and all of the earlier generated results of the min* processing of the absolute value of all of the edge messages except for the minimal one, shown as $M_m$ below. This may be described mathematically as follows: $A = \min^*\{M_m, V_{min}\}$.

The method then involves updating of the edge messages with respect to bit nodes, ($L_b(e_i)$). This is implemented as a two part process that involves assigning and computing. The method involves assigning the minimal indexed edge messages with respect to bit nodes, $L_b(e_{I_{min}})$.

For the edge message indexed by the minimal index, $L_b(e_{I_{min}})$, this particular edge message is simply assigned to be the product of the sign function of all of the edge messages, $S_m$, times the sign function of that particular edge message indexed by the minimal index, $\text{sign}(L_c(e_{I_{min}}))$, times the min* result of the min* processing of the absolute value of all of the edge messages except for the minimal one, $M_m$, when this min* result is in fact greater than zero. Otherwise, when this min* result is not greater than zero, the edge message indexed by the minimal index, $L_b(e_{I_{min}})$, is alternatively assigned to be a value of zero. This may be described mathematically as follows:

$$L_b(e_{I_{min}}) = \begin{cases} S_m \times \text{sign}(L_c(e_{I_{min}})) \times M_m & M_m > 0 \\ 0 & \text{otherwise} \end{cases}.$$

For all of the other edge messages (e.g. those edge messages that are not indexed by the minimal index, where $i \neq I_{min}$), those edge messages, $L_b(e_i)$, are actually computed using min†– processing during the iterative decoding processing of LDPC coded signal decoding.

These edge messages are computed to be the product of the sign function of that particular edge message, $\text{sign}(L_c(e_i))$, times the sign function of all of the edge messages, $S_m$, times the result of the min†– processing of the min* result of the absolute value of all of the edge messages, A, and the absolute value of that particular edge message, $|L_c(e_i)|$. This may be described mathematically as follows:

for $i \neq I_{min}$, $L_b(e_i) = \text{sign}(L_c(e_i)) \times S_m \times \min\dagger-(A, |L_c(e_i)|)$.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus comprising:
   an m-bit symbol metric computer that is operable to calculate a plurality of m-bit symbol metrics that correspond to a symbol of an LDPC (Low Density Parity Check) coded signal, wherein the symbol has m-bits and wherein the LDPC coded signal includes a plurality of symbols;
   a symbol node calculator that is operable to calculate a plurality of bit metrics using the plurality of m-bit symbol metrics;
   a bit node calculator that is operable to calculate soft messages corresponding to the m-bits of the symbol using the plurality of bit metrics;
   a check node operator that is operable to provide a plurality of edge messages to the bit node calculator, wherein:
   the plurality of edge messages corresponds to a plurality of edges that communicatively couple a plurality of bit nodes to a plurality of check nodes within an LDPC bipartite graph that corresponds to an LDPC code by which the LDPC coded signal is generated;
   the bit node calculator is operable to update the plurality of edge messages provided from the check node operator using the plurality of bit metrics calculated by the symbol node calculator;
   the bit node calculator is operable to perform min†– (min-dagger minus) processing when updating the plurality of edge messages;
   the bit node calculator is operable to provide the updated plurality of edge messages to the check node operator while the bit node calculator is operable to update the soft messages corresponding to the m-bits of the symbol using the updated plurality of edge messages; and the bit node calculator and the check node operator operate cooperatively to perform iterative decoding and to output best estimates of the m-bits of the symbol of the LDPC coded signal using latest updated soft messages corresponding to the m-bits of the symbol of the LDPC coded signal.

2. The apparatus of claim 1, wherein:

during a last iterative decoding iteration, the bit node calculator is operable to make a best estimate for the symbol of the LDPC coded signal using that symbol's most recently updated soft messages; and further comprising:

a hard limiter that is operable to make bit estimates based on the best estimate for the symbol of the LDPC coded signal such that the bit estimates are hard decisions for each of the individual bits of the symbol.

3. The apparatus of claim 1, further comprising:

a syndrome calculator that is operable to determine whether each syndrome of a plurality of syndromes associated with the LDPC code is substantially equal to zero as defined by a predetermined degree of precision during each iterative decoding iteration; and when, during a given iterative decoding iteration, the syndrome calculator is operable to determine that each of the syndromes of the plurality of syndromes associated with the LDPC code is substantially equal to zero as defined by the predetermined degree of precision, then the syndrome calculator is operable to determine that the given iterative decoding iteration is a last iterative decoding iteration.

4. The apparatus of claim 1, wherein:

the updating of the updating the plurality of edge messages that is performed by the bit node calculator is mathematically performed in the logarithmic domain using the min†− processing;

the bit node calculator includes a min†− processor that is operable to perform the min†− processing when updating the plurality of edge messages;

the min†− processor is operable to perform min*− (mm-star minus) processing on at least 2 input values;

when the results of the min*− processing on the at least 2 input values is not substantially greater than zero, then the min†− processor is operable to output a zero valued output; and when the results of the min*− processing on the at least 2 input values is substantially greater than zero, then the min†− processor is operable to output a result generated by the min*− processing on the at least 2 input values.

5. The apparatus of claim 4, wherein:

the bit node calculator includes a min*− processor to perform the min*− processing on the at least 2 input values;

the min*− processor is operable to determine a minimum value among the at least 2 input values;

the min*− processor is operable to calculate a logarithmic correction factor using the at least 2 input values; and the min*− processor is operable to combine the minimum value and the logarithmic correction factor to generate the result of the min*− processing on the at least 2 input values.

6. The apparatus of claim 1, wherein:

the bit node calculator is operable selectively to perform min†− processing when updating edge messages within the plurality of edge messages that are not indexed by a minimal index; and the bit node calculator is operable selectively to assign edge messages within the plurality of edge messages that are indexed by the minimal index to a predetermined value.

7. The apparatus of claim 1, wherein:

the bit node calculator is operable selectively to perform min†− processing when updating edge messages within the plurality of edge messages that are not indexed by a minimal index; and the bit node calculator is operable selectively to assign edge messages within the plurality of edge messages that are indexed by the minimal index to a predetermined value.

8. The apparatus of claim 1, wherein:

the LDPC coded signal is a variable modulation signal;

a first symbol of the plurality of symbols is mapped according to a first modulation that includes a first constellation and a corresponding first mapping; and a second symbol of the plurality of symbols is mapped according to a second modulation that includes a second constellation and a corresponding second mapping.

9. The apparatus of claim 8, wherein:

the first modulation includes an 8 PSK (8 Phase Shift Key) shaped constellation whose constellation points are mapped according to the first mapping; and the second modulation includes the 8 PSK shaped constellation whose constellation points are mapped according to the second mapping.

10. The apparatus of claim 1, wherein:

the LDPC coded signal is a variable code rate signal;

a first symbol of the plurality of symbols is encoded according to a first code rate; and a second symbol of the plurality of symbols is encoded according to a second code rate.

11. The apparatus of claim 1, wherein:

the apparatus is a communication device; and the communication device is implemented within at least one of a satellite communication system, an HDTV (High Definition Television) communication system, a cellular communication system, a microwave communication system, a point-to-point radio communication system, a uni-directional communication system, a bi-directional communication system, a one to many communication system, a fiber-optic communication system, a WLAN (Wireless Local Area Network) communication system, and a DSL (Digital Subscriber Line) communication system.

12. An apparatus, comprising:

a check node operator;

a bit node calculator that is operable to update plurality of edge messages provided from the check node operator using a plurality of bit metrics, wherein:

the bit node calculator is operable to perform min†− (min-dagger minus) processing when updating the plurality of edge messages;

the updating of the updating the plurality of edge messages that is performed by the bit node calculator is mathematically performed in the logarithmic domain using min†− processing;

the bit node calculator includes a min†− processor that is operable to perform the min†− processing when updating the plurality of edge messages;

the min†− processor is operable to perform min*− (min-star minus) processing on at least 2 input values;

when the results of the min*− processing on the at least 2 input values is not substantially greater than zero, then the min†− processor is operable to output a zero valued output; and when the results of the min*− processing on the at least 2 input values is substantially greater than zero, then the min†− processor is operable to output a result generated by the min*− processing on the at least 2 input values.

13. The apparatus of claim 12, wherein:

the bit node calculator includes a min*− processor that is operable to perform the min*− processing on the at least 2 input values;

the min*− processor is operable to determine a minimum value among the at least 2 input values;

the min*− processor is operable to calculate a logarithmic correction factor using the at least 2 input values; and the min*− processor is operable to combine the minimum value and the logarithmic correction factor to generate the result of the min*− processing on the at least 2 input values.

14. The apparatus of claim 12, wherein:

the bit node calculator is operable selectively to perform min†− processing when updating edge messages within the plurality of edge messages that are not indexed by a minimal index; and the bit node calculator is operable selectively to assign edge messages within the plurality of edge messages that are indexed by the minimal index to a predetermined value.

15. The apparatus of claim 12, wherein:

the LDPC coded signal is a variable modulation signal that includes a plurality of symbols;

a first symbol of the plurality of symbols is mapped according to a first modulation that includes a first constellation and a corresponding first mapping; and a second symbol of the plurality of symbols is mapped according to a second modulation that includes a second constellation and a corresponding second mapping.

16. The apparatus of claim 15, wherein:

the first modulation includes an 8 PSK (8 Phase Shift Key) shaped constellation whose constellation points are mapped according to the first mapping; and the second modulation includes the 8 PSK shaped constellation whose constellation points are mapped according to the second mapping.

17. The apparatus of claim 12, wherein:

the LDPC coded signal is a variable code rate signal that includes a plurality of symbols;

a first symbol of the plurality of symbols is encoded according to a first code rate; and a second symbol of the plurality of symbols is encoded according to a second code rate.

18. The apparatus of claim 12, wherein:

the apparatus is a communication device; and the communication device is implemented within at least one of a satellite communication system, an HDTV (High Definition Television) communication system, a cellular communication system, a microwave communication system, a point-to-point radio communication system, a uni-directional communication system, a bi-directional communication system, a one to many communication system, a fiber-optic communication system, a WLAN (Wireless Local Area Network) communication system, and a DSL (Digital Subscriber Line) communication system.

19. An apparatus, comprising:

a min†− (min-dagger minus) processor that includes a min*− (min-star minus) processor that is operable to perform min*− (min-star minus) processing on at least 2 input values, wherein:

when the results of the min*− processing on the at least 2 input values is not substantially greater than zero, then the min†− processor is operable to output a zero valued output;

when the results of the min*− processing on the at least 2 input values is substantially greater than zero, then the min†− processor is operable to output a result generated by the min*− processing on the at least 2 input values;

the min*− processor is operable to determine a minimum value among the at least 2 input values;

the min*− processor is operable to calculate a logarithmic correction factor using the at least 2 input values; and the min*− processor is operable to combine the minimum value and the logarithmic correction factor to generate the result of the min*− processing on the at least 2 input values.

20. The apparatus of claim 19, wherein:

the min†− processor is included within a bit node calculator that is operable to update a plurality of edge messages provided from a check node operator using a plurality of bit metrics;

the bit node calculator is operable to perform min†− processing when updating the plurality of edge messages; and the updating of the plurality of edge messages that is performed by the bit node calculator is mathematically performed in the logarithmic domain by the min†− processor.

21. The apparatus of claim 20, wherein:

the bit node calculator is operable selectively to perform min†− processing when updating edge messages within the plurality of edge messages that are not indexed by a minimal index; and the bit node calculator is operable selectively to assign edge messages within the plurality of edge messages that are indexed by the minimal index to a predetermined value.

22. The apparatus of claim 19, wherein:

the LDPC coded signal is a variable modulation signal that includes a plurality of symbols;

a first symbol of the plurality of symbols is mapped according to a first modulation that includes a first constellation and a corresponding first mapping; and a second symbol of the plurality of symbols is mapped according to a second modulation that includes a second constellation and a corresponding second mapping.

23. The apparatus of claim 22, wherein:

the first modulation includes an 8 PSK (8 Phase Shift Key) shaped constellation whose constellation points are mapped according to the first mapping; and the second modulation includes the 8 PSK shaped constellation whose constellation points are mapped according to the second mapping.

24. The apparatus of claim 19, wherein:

the LDPC coded signal is a variable code rate signal that includes a plurality of symbols;

a first symbol of the plurality of symbols is encoded according to a first code rate; and a second symbol of the plurality of symbols is encoded according to a second code rate.

25. The apparatus of claim 19, wherein:
the apparatus is a communication device; and
the communication device is implemented within at least one of a satellite communication system, an HDTV (High Definition Television) communication system, a cellular communication system, a microwave communication system, a point-to-point radio communication system, a uni-directional communication system, a bi-directional communication system, a one to many communication system, a fiber-optic communication system, a WLAN (Wireless Local Area Network) communication system, and a DSL (Digital Subscriber Line) communication system.

26. A method for updating a plurality of edge messages using min†− (min-dagger minus) processing when decoding an LDPC (Low Density Parity Check) coded signal, the method comprising
receiving a plurality of edge messages with respect to a plurality of check nodes within an LDPC bipartite graph that corresponds to an LDPC code;
initializing a minimal absolute valued edge message of the plurality of the plurality of edge messages;
initializing a minimal index for the plurality of the plurality of edge messages;
initializing a sign function of a first edge message of the plurality of edge messages;
performing decoding processing across all other edge messages, besides the first edge message, of the plurality of edge messages that includes:
selectively replacing the minimal absolute valued edge message with an absolute value of a current edge message when the absolute value of the current edge message is substantially less than or equal with the minimal absolute valued edge message and updating the minimal index for the plurality of the plurality of edge messages;
computing min* (min-star) results of the absolute values of all edge messages of the plurality of edge messages except for the minimal absolute valued edge message;
computing a sign function of a current edge message using a sign function of a previous edge message, as defined according to the decoding processing;
computing min* results of absolute values of all edge messages of the plurality of edge messages; and
updating the plurality of edge messages with respect to a plurality of bit nodes within the LDPC bipartite graph that corresponds to the LDPC code using min†− processing.

27. The method of claim 26, further comprising:
selectively performing min†− processing when updating edge messages within the plurality of edge messages that are not indexed by the minimal index for the plurality of the plurality of edge messages; and
selectively assigning edge messages within the plurality of edge messages that are indexed by the minimal index to a predetermined value.

28. The method of claim 26, wherein:
the min†− processing performs min*− (min-star minus) processing on at least 2 input values;
when the results of the min*− processing on the at least 2 input values is not substantially greater than zero, then the min†− processing outputs a zero valued output;
when the results of the min*− processing on the at least 2 input values is substantially greater than zero, then the min†− processing outputs a result generated by the min*− processing on the at least 2 input values;
the min*− processing determines a minimum value among the at least 2 input values;
the min*− processing calculates a logarithmic correction factor using the at least 2 input values; and
the min*− processing combines the minimum value and the logarithmic correction factor to generate the result of the min*− processing on the at least 2 input values.

29. The method of claim 26, wherein:
the LDPC coded signal is a variable modulation signal that includes a plurality of symbols;
a first symbol of the plurality of symbols is mapped according to a first modulation that includes a first constellation and a corresponding first mapping; and
a second symbol of the plurality of symbols is mapped according to a second modulation that includes a second constellation and a corresponding second mapping.

30. The method of claim 29, wherein:
the first modulation includes an 8 PSK (8 Phase Shift Key) shaped constellation whose constellation points are mapped according to the first mapping; and
the second modulation includes the 8 PSK shaped constellation whose constellation points are mapped according to the second mapping.

31. The method of claim 26, wherein:
the LDPC coded signal is a variable code rate signal that includes a plurality of symbols;
a first symbol of the plurality of symbols is encoded according to a first code rate; and
a second symbol of the plurality of symbols is encoded according to a second code rate.

32. The method of claim 26, wherein:
the method is performed within a decoder;
the decoder is implemented within a communication device; and
the communication device is implemented within at least one of a satellite communication system, an HDTV (High Definition Television) communication system, a cellular communication system, a microwave communication system, a point-to-point radio communication system, a uni-directional communication system, a bi-directional communication system, a one to many communication system, a fiber-optic communication system, a WLAN (Wireless Local Area Network) communication system, and a DSL (Digital Subscriber Line) communication system.

33. An apparatus, comprising:
a min†− (min-dagger minus) processor that is operable to perform min*− (min-star minus) processing on at least 2 input values, wherein:
when the results of the min*− processing on the at least 2 input values is not substantially greater than zero, the min†− processor is operable to output a zero valued output;
when the results of the min*− processing on the at least 2 input values is substantially greater than zero, the min†− processor is operable to output result generated by the min*− processing on the at least 2 input values;
the min†− processor include a min*− (min-star minus) processor:
the min*− processor is operable to determine a minimum value among the at least 2 input values;
the min*− processor is operable to calculate a logarithmic correction factor using the at least 2 input values; and
the min*− processor is operable to combine the minimum value and the logarithmic correction factor to generate the result of the min*− processing on the at least 2 input values.

34. The apparatus of claim 33, wherein:
the apparatus is operable to decode an LDPC (Low Density Parity Check) coded signal;
the apparatus includes a check node operator;
the apparatus includes a bit node calculator;
the bit node calculator includes the min†– processor;
the min†– processor is operable to update a plurality of edge messages provided from the check node operator using a plurality of bit metrics;
the bit node calculator is operable to perform min†– processing when updating the plurality of edge messages; and
the updating of the updating the plurality of edge messages that is performed by the bit node calculator is mathematically performed in the logarithmic domain using the min†– processing.

35. The apparatus of claim 34, wherein:
the min†– processor is operable selectively to perform min†– processing when updating edge messages within the plurality of edge messages that are not indexed by a minimal index for the plurality of the plurality of edge messages; and
the min†– processor is operable selectively to assign edge messages within the plurality of edge messages that are indexed by the minimal index to a predetermined value.

* * * * *

UNITED STATES PATENT AND TRADEMARK OFFICE
CERTIFICATE OF CORRECTION

PATENT NO.        : 7,149,953 B2                                   Page 1 of 1
APPLICATION NO.   : 10/782142
DATED             : December 12, 2006
INVENTOR(S)       : Kelly Cameron et al.

It is certified that error appears in the above-identified patent and that said Letters Patent is hereby corrected as shown below:

Column 1, line 24: replace "pending."" with --pending.--

Column 43, line 39, in Claim 4: replace "mm" with --min--

Signed and Sealed this

Eighth Day of July, 2008

JON W. DUDAS
*Director of the United States Patent and Trademark Office*